US012505807B2

(12) United States Patent
Feng et al.

(10) Patent No.: US 12,505,807 B2
(45) Date of Patent: Dec. 23, 2025

(54) SHIFT REGISTER UNIT, DISPLAY DRIVING CIRCUIT, DISPLAY PANEL AND CONTROL METHOD

(71) Applicants: Hefei BOE Joint Technology Co., Ltd., Hefei (CN); Beijing BOE Technology Development Co., Ltd., Beijing (CN)

(72) Inventors: Xuehuan Feng, Beijing (CN); Yongqian Li, Beijing (CN)

(73) Assignees: Hefei BOE Joint Technology Co.,Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/703,506

(22) PCT Filed: Aug. 31, 2023

(86) PCT No.: PCT/CN2023/116074
§ 371 (c)(1),
(2) Date: Apr. 22, 2024

(87) PCT Pub. No.: WO2025/043587
PCT Pub. Date: Mar. 6, 2025

(65) Prior Publication Data
US 2025/0078768 A1 Mar. 6, 2025

(51) Int. Cl.
*G09G 3/3266* (2016.01)
*G09G 3/3233* (2016.01)
*G11C 19/28* (2006.01)

(52) U.S. Cl.
CPC ......... *G09G 3/3266* (2013.01); *G09G 3/3233* (2013.01); *G11C 19/287* (2013.01); (Continued)

(58) Field of Classification Search
CPC ............... G09G 3/3266; G09G 3/3233; G09G 2300/0819; G09G 2310/0286; G09G 2310/061; G09G 2320/045
See application file for complete search history.

(56) References Cited

U.S. PATENT DOCUMENTS 9,595,222 B2 * 3/2017 Takahara ............. G09G 3/3233
9,773,450 B2 * 9/2017 Takahara ............. G09G 3/3266
(Continued)

FOREIGN PATENT DOCUMENTS

CN 110739020 A 1/2020
CN 116645996 A 8/2023
(Continued)

*Primary Examiner* — Michael J Jansen, II
(74) *Attorney, Agent, or Firm* — Westman, Champlin & Koehler, P.A.

(57) ABSTRACT

A shift register unit, a display driving circuit, a display panel, and a control method. The shift register unit includes: an input circuit configured to provide signals of an input signal terminal (IN) and a power signal terminal (VGH) to first and second pull-up nodes (Q1, Q2); a first control circuit configured to control potentials of the first pull-down node (QB1), and the first pull-up node (Q1); a second control circuit configured to control potentials of the second pull-up node (Q2) and the second pull-down node (QB2) based on the first pull-up node (Q1) and the first pull-down node (QB1); and an output circuit configured to provide the signal of one of the power signal terminal (VGH) and the reference signal terminal (VGL) to an output signal terminal (OUT) under control of the second pull-up node (Q2) and the second pull-down node (QB2).

20 Claims, 16 Drawing Sheets

(52) U.S. Cl.
CPC ............... *G09G 2300/0819* (2013.01); *G09G 2310/0286* (2013.01); *G09G 2310/061* (2013.01); *G09G 2320/045* (2013.01)

(56) References Cited

U.S. PATENT DOCUMENTS

| | | | | |
|---|---|---|---|---|
| 9,805,638 | B2 * | 10/2017 | Ma | G09G 3/3677 |
| 10,008,154 | B2 * | 6/2018 | Li | G11C 19/28 |
| 10,769,977 | B2 * | 9/2020 | Xiang | G09G 3/20 |
| 10,811,114 | B2 * | 10/2020 | Yuan | G09G 3/3258 |
| 10,964,359 | B2 * | 3/2021 | Zheng | G09G 3/20 |
| 11,106,296 | B2 * | 8/2021 | Yang | G09G 3/3677 |
| 11,270,649 | B2 * | 3/2022 | Chen | G09G 3/3266 |
| 11,373,601 | B2 * | 6/2022 | Wang | G11C 19/28 |
| 11,380,265 | B2 * | 7/2022 | Park | G09G 3/3233 |
| 11,663,976 | B2 * | 5/2023 | Yao | G09G 3/3233 345/204 |
| 11,721,268 | B2 * | 8/2023 | Lai | G09G 3/2092 345/204 |
| 11,862,098 | B2 * | 1/2024 | Shang | G09G 3/3266 |
| 11,869,415 | B2 * | 1/2024 | Kim | G09G 3/2003 |
| 11,967,278 | B2 * | 4/2024 | Xiao | G09G 3/3233 |
| 12,002,407 | B2 * | 6/2024 | Shang | G09G 3/3266 |
| 12,205,506 | B2 * | 1/2025 | Lu | G09G 3/20 |
| 2015/0255015 | A1 * | 9/2015 | Takahara | G09G 3/3225 345/76 |
| 2015/0262528 | A1 * | 9/2015 | Takahara | G09G 3/3258 345/212 |
| 2016/0284263 | A1 * | 9/2016 | Ma | G09G 3/3677 |
| 2016/0351128 | A1 * | 12/2016 | Li | G11C 19/28 |
| 2019/0180834 | A1 * | 6/2019 | Yuan | G09G 3/3258 |
| 2019/0325800 | A1 * | 10/2019 | Xiang | G11C 19/287 |
| 2019/0347997 | A1 * | 11/2019 | Park | G11C 19/28 |
| 2020/0013473 | A1 * | 1/2020 | Xuan | G09G 3/20 |
| 2020/0265877 | A1 * | 8/2020 | Zheng | G11C 19/28 |
| 2021/0118373 | A1 * | 4/2021 | Chen | G11C 19/28 |
| 2021/0200351 | A1 * | 7/2021 | Yang | G09G 3/3677 |
| 2022/0068212 | A1 * | 3/2022 | Yao | G09G 3/3233 |
| 2022/0076611 | A1 * | 3/2022 | Lai | G09G 3/2092 |
| 2022/0114969 | A1 * | 4/2022 | Wang | G09G 3/3266 |
| 2022/0383822 | A1 * | 12/2022 | Shang | G09G 3/3266 |
| 2023/0005415 | A1 * | 1/2023 | Shang | G09G 3/3266 |
| 2023/0107775 | A1 * | 4/2023 | Kim | H03K 17/6871 345/83 |
| 2023/0169917 | A1 * | 6/2023 | Xiao | G09G 3/3233 345/204 |
| 2023/0186858 | A1 | 6/2023 | Kim et al. | |
| 2024/0161669 | A1 * | 5/2024 | Lu | G09G 3/3266 |
| 2024/0290277 | A1 * | 8/2024 | Seo | G09G 3/32 |

FOREIGN PATENT DOCUMENTS

| | | | |
|---|---|---|---|
| KR | 20210045034 | A | 4/2021 |
| KR | 20210061557 | A | 5/2021 |
| KR | 20230009250 | A | 1/2023 |
| WO | 2023028749 | A1 | 3/2023 |

* cited by examiner

SHIFT REGISTER UNIT, DISPLAY DRIVING CIRCUIT, DISPLAY PANEL AND CONTROL METHOD

CROSS REFERENCE TO RELATED APPLICATION(S)

This application is a Section 371 National Stage Application of International Application No. PCT/CN2023/116074, filed on Aug. 31, 2023, entitled "SHIFT REGISTER UNIT, DISPLAY DRIVING CIRCUIT, DISPLAY PANEL AND CONTROL METHOD", the contents of which are incorporated herein by reference in their entireties.

TECHNICAL FIELD

The present disclosure relates to a field of display technology, and in particular, to a shift register unit, a display driving circuit, a pixel driving circuit, a display panel, and a method for controlling a shift register unit.

BACKGROUND

In a display field, especially in OLED displays, oxides are widely used in medium to large-sized display devices due to their good uniformity. In a process of driving pixels for display, internal compensation has received widespread attention due to its low cost and good compensation effect. However, it is difficult to achieve Pulse Width Modulation (PWM) waveforms in N-type TFTs.

SUMMARY

Embodiments of the present disclosure provide a shift register unit, including: an input circuit coupled to an input signal terminal of the shift register unit, a power signal terminal of the shift register unit, a first pull-up node of the shift register unit, and a first pull-down node of the shift register unit, and configured to provide a signal of the input signal terminal and a signal of the power signal terminal to the first pull-up node and the first pull-down node; a first control circuit coupled to the first pull-up node and the first pull-down node, and configured to control a potential of the first pull-down node based on a potential of the first pull-up node, and control a potential of the first pull-up node based on a potential of the first pull-down node; a second control circuit coupled to the first pull-up node of the shift register unit, the first pull-down node of the shift register unit, a second pull-up node of the shift register unit, and a second pull-down node of the shift register unit, and configured to control a potential of the second pull-up node based on a signal of the first pull-up node, and control a potential of the second pull-down node based on a signal of the first pull-down node; and an output circuit coupled to the second pull-up node of the shift register unit, the second pull-down node of the shift register unit, the power signal terminal of the shift register unit, a reference signal terminal of the shift register unit, and an output signal terminal of the shift register unit, and configured to provide one of the signal of the power signal terminal and a signal of the reference signal terminal to the output signal terminal under control of the second pull-up node and the second pull-down node.

For example, the second control circuit includes: a first transmission control sub-circuit coupled to the first pull-up node, a third pull-up node of the shift register unit, and a second clock signal terminal of the shift register unit, and configured to provide a signal of the second clock signal terminal to the third pull-up node under control of the first pull-up node; and a second transmission control sub-circuit coupled to the second pull-up node, the third pull-up node, and the second clock signal terminal, and configured to provide a signal at the third pull-up node to the second pull-up node under control of the second clock signal terminal.

For example, the first transmission control sub-circuit includes a first transistor and a first capacitor, a gate of the first transistor is coupled to the first pull-up node, a first electrode of the first transistor is coupled to the second clock signal terminal, a second electrode of the first transistor is coupled to the third pull-up node, and a first electrode of the first capacitor is coupled to the first pull-up node, and a second electrode of the first capacitor is coupled to the third pull-up node; and wherein the second transmission control sub-circuit includes a second transistor, a gate of the second transistor is coupled to the second clock signal terminal, a first electrode of the second transistor is coupled to the third pull-up node, and a second electrode of the second transistor is coupled to the second pull-up node.

For example, the second control circuit further includes a third transmission control sub-circuit coupled to the first pull-down node, the reference signal terminal, and the third pull-up node, and configured to provide the signal of the reference signal terminal to the third pull-up node under control of the first pull-down node.

For example, the third transmission control sub-circuit includes a third transistor and a second capacitor, a gate of the third transistor is coupled to the first pull-down node, a first electrode of the third transistor is coupled to the reference signal terminal, a second electrode of the third transistor is coupled to the third pull-up node, a first electrode of the second capacitor is coupled to the first pull-down node, and a second electrode of the second capacitor is coupled to the reference signal terminal.

For example, the second control circuit further includes a fourth transmission control sub-circuit coupled to the first pull-down node, the second pull-down node, and the second clock signal terminal, and configured to provide a signal at the first pull-down node to the second pull-down node under control of the second clock signal terminal.

For example, the fourth transmission control sub-circuit includes a fourth transistor, a gate of the fourth transistor is coupled to the second clock signal terminal, a first electrode of the fourth transistor is coupled to the first pull-down node, and a second electrode of the fourth transistor is coupled to the second pull-down node.

For example, the shift register unit further includes: a first voltage stabilizing circuit coupled between the first pull-up node and the first transmission control sub-circuit, wherein the first voltage stabilizing circuit is coupled with the first transmission control sub-circuit at a fourth pull-up node, and the first voltage stabilizing circuit is configured to stabilize a potential of the fourth pull-up node.

For example, the first voltage stabilizing circuit includes a fifth transistor, a gate of the fifth transistor is coupled to the power signal terminal, a first electrode of the fifth transistor is coupled to the first pull-up node, and a second electrode of the fifth transistor is coupled to the fourth pull-up node.

For example, the input circuit includes a first input sub-circuit coupled to the input signal terminal, the first pull-up node, and a first clock signal terminal of the shift register unit, and configured to provide the signal of the input signal terminal to the first pull-up node under control of the first clock signal terminal; and a second input sub-circuit coupled to the power signal terminal, the first pull-down node, and the first clock signal terminal, and configured to provide the signal of the power signal terminal to the first pull-down node under control of the first clock signal terminal.

For example, the first input sub-circuit includes a sixth transistor, a gate of the sixth transistor is coupled to the first clock signal terminal, a first electrode of the sixth transistor is coupled to the input signal terminal, and a second electrode of the sixth transistor is coupled to the first pull-up node; and wherein the second input sub-circuit includes a seventh transistor, a gate of the seventh transistor is coupled to the first clock signal terminal, a first electrode of the seventh transistor is coupled to the power signal terminal, and a second electrode of the seventh transistor is coupled to the first pull-down node.

For example, the first control circuit includes: a pull-up control sub-circuit coupled to the first pull-up node, the first pull-down node, and the first clock signal terminal, and configured to provide a signal of the first clock signal terminal to the first pull-down node under control of the first pull-up node; and a pull-down control sub-circuit coupled to the first pull-up node, the first pull-down node, the reference signal terminal, and the second clock signal terminal of the shift register unit, and configured to provide the signal of the reference signal terminal to the first pull-up node under control of the second clock signal terminal and the first pull-down node.

For example, the pull-up control sub-circuit includes an eighth transistor, a gate of the eighth transistor is coupled to the first pull-up node, a first electrode of the eighth transistor is coupled to the first clock signal terminal, and a second electrode of the eighth transistor is coupled to the first pull-down node; and wherein the pull-down control sub-circuit includes a ninth transistor and a tenth transistor, a gate of the ninth transistor is coupled to the second clock signal terminal, a first electrode of the ninth transistor is coupled to a second electrode of the tenth transistor, a second electrode of the ninth transistor is coupled to the first pull-up node or the fourth pull-up node, and a gate of the tenth transistor is coupled to the first pull-down node, and a first electrode of the tenth transistor is coupled to the reference signal terminal.

For example, the output circuit includes: a first output sub-circuit coupled to the second pull-up node, the output signal terminal, and one of the power signal terminal and the reference signal terminal, and configured to provide the signal of the one of the power signal terminal and the reference signal terminal to the output signal terminal under control of the second pull-up node; and a second output sub-circuit coupled to the second pull-down node, the output signal terminal, and the other of the power signal terminal and the reference signal terminal, and configured to provide the signal of the other of the power signal terminal and the reference signal terminal to the output signal terminal under control of the second pull-down node.

For example, the first output sub-circuit includes an eleventh transistor and a third capacitor, a gate of the eleventh transistor is coupled to the second pull-up node, a first electrode of the eleventh transistor is coupled to the power signal terminal, a second electrode of the eleventh transistor is coupled to the output signal terminal, a first electrode of the third capacitor is coupled to the second pull-up node, and a second electrode of the third capacitor is coupled to the output signal terminal or the second clock signal terminal; and wherein the second output sub-circuit includes a twelfth transistor and a fourth capacitor, a gate of the twelfth transistor is coupled to the second pull-down node, a first electrode of the twelfth transistor is coupled to the reference signal terminal, a second electrode of the twelfth transistor is coupled to the output signal terminal, a first electrode of the fourth capacitor is coupled to the second pull-down node, and a second electrode of the fourth capacitor is coupled to the reference signal terminal.

For example, the second output sub-circuit further includes a thirteenth transistor and a fourteenth transistor, wherein the first electrode of the twelfth transistor is coupled to the reference signal terminal through the thirteenth transistor, wherein a gate of the thirteenth transistor is coupled to the second pull-down node, a first electrode of the thirteenth transistor is coupled to the reference signal terminal, and a second electrode of the thirteenth transistor is coupled to the first electrode of the twelfth transistor; and wherein a gate of the fourteenth transistor is coupled to the output signal terminal, a first electrode of the fourteenth transistor is coupled to the power signal terminal, and a second electrode of the fourteenth transistor is coupled to the first electrode of the twelfth transistor.

For example, the first output sub-circuit includes an eleventh transistor and a third capacitor, a gate of the eleventh transistor is coupled to the second pull-up node, a first electrode of the eleventh transistor is coupled to the reference signal terminal, a second electrode of the eleventh transistor is coupled to the output signal terminal, a first electrode of the third capacitor is coupled to the second pull-up node, and a second electrode of the third capacitor is coupled to the reference signal terminal; and the second output sub-circuit includes a twelfth transistor and a fourth capacitor, a gate of the twelfth transistor is coupled to the second pull-down node, a first electrode of the twelfth transistor is coupled to the power signal terminal, a second electrode of the twelfth transistor is coupled to the output signal terminal, a first electrode of the fourth capacitor is coupled to the second pull-down node, and a second electrode of the fourth capacitor is coupled to the output signal terminal.

For example, the first output sub-circuit further includes a thirteenth transistor and a fourteenth transistor, wherein the second electrode of the eleventh transistor is coupled to the output signal terminal through the thirteenth transistor, wherein a gate of the thirteenth transistor is coupled to the second pull-up node, a first electrode of the thirteenth transistor is coupled to the second electrode of the eleventh transistor, and a second electrode of the thirteenth transistor is coupled to the output signal terminal; and wherein a gate of the fourteenth transistor is coupled to the output signal terminal, a first electrode of the fourteenth transistor is coupled to the power signal terminal, and a second electrode of the fourteenth transistor is coupled to the second electrode of the eleventh transistor.

For example, the shift register unit further includes a second voltage stabilizing circuit coupled between the first pull-down node and the fourth transmission control sub-circuit, wherein the second voltage stabilizing circuit is coupled with the fourth transmission sub-circuit at a third pull-down node, and the second voltage stabilizing circuit is configured to stabilize a potential of the third pull-down node.

For example, the second voltage stabilizing circuit includes: a fifteenth transistor and a sixteenth transistor, wherein a gate of the fifteenth transistor is coupled to the first pull-down node, a first electrode of the fifteenth transistor is coupled to the second clock signal terminal, and a second electrode of the fifteenth transistor is coupled to the first electrode of the fourth transistor in the fourth transmission control sub-circuit at the third pull-down node; and wherein a gate of the sixteenth transistor is coupled to the first pull-up node or the fourth pull-up node, a first electrode of the sixteenth transistor is coupled to the reference signal terminal, and a second electrode of the sixteenth transistor is coupled to the third pull-down node.

For example, the second voltage stabilizing circuit further includes a seventeenth transistor, and wherein a gate of the seventeenth transistor is coupled to the second clock signal terminal, a first electrode of the seventeenth transistor is coupled to the second electrode of the sixteenth transistor, and a second electrode of the seventeenth transistor is coupled to the second electrode of the fifteenth transistor.

For example, the third pull-up node serves as a control output terminal of the shift register unit for cascading connections with another shift register unit.

For example, the input circuit includes a first input sub-circuit coupled to the power signal terminal, the first pull-up node, and the first clock signal terminal of the shift register unit, and configured to provide the signal of the power signal terminal to the first pull-up node under control of the first clock signal terminal; and a second input sub-circuit coupled to the input signal terminal, the first pull-down node, and the first clock signal terminal, and configured to provide the signal of the input signal terminal to the first pull-down node under control of the first clock signal terminal.

For example, the first input sub-circuit includes a sixth transistor, and a gate of the sixth transistor is coupled to the first clock signal terminal, a first electrode of the sixth transistor is coupled to the power signal terminal, and a second electrode of the sixth transistor is coupled to the first pull-up node; and the second input sub-circuit includes a seventh transistor, and a gate of the seventh transistor is coupled to the first clock signal terminal, a first electrode of the seventh transistor is coupled to the input signal terminal, and a second electrode of the seventh transistor is coupled to the first pull-down node.

For example, the first control circuit includes: a pull-up control sub-circuit coupled to the first pull-up node, the first pull-down node, and the first clock signal terminal, and configured to provide a signal of the first clock signal terminal to the first pull-up node under control of the first pull-down node; and a pull-down control sub-circuit coupled to the first pull-up node, the first pull-down node, the reference signal terminal, and the second clock signal terminal of the shift register unit, and configured to provide the signal of the reference signal terminal to the first pull-down node under control of the second clock signal terminal and the first pull-up node.

For example, the pull-up control sub-circuit includes an eighth transistor, a gate of the eighth transistor is coupled to the first pull-down node, a first electrode of the eighth transistor is coupled to the first clock signal terminal, and a second electrode of the eighth transistor is coupled to the first pull-up node; and the pull-down control sub-circuit includes a ninth transistor and a tenth transistor, and a gate of the ninth transistor is coupled to the first pull-up node, a first electrode of the ninth transistor is coupled to the reference signal terminal, a second electrode of the ninth transistor is coupled to the first electrode of the tenth transistor, and a gate of the tenth transistor is coupled to the second clock signal terminal, and a second electrode of the tenth transistor is coupled to the first pull-down node.

For example, the output circuit includes: a first output sub-circuit coupled to the reference signal terminal, the second pull-up node, and the output signal terminal, and configured to provide the signal of the reference signal terminal to the output signal terminal under control of the second pull-up node; and a second output sub-circuit coupled to the power signal terminal, the second pull-down node, and the output signal terminal, and configured to provide the signal of the power signal terminal to the output signal terminal under control of the second pull-down node.

For example, the first output sub-circuit includes an eleventh transistor and a third capacitor, and a gate of the eleventh transistor is coupled to the second pull-up node, a first electrode of the eleventh transistor is coupled to the reference signal terminal, and a second electrode of the eleventh transistor is coupled to the output signal terminal, and a first electrode of the third capacitor is coupled to the second pull-up node, and a second electrode of the third capacitor is coupled to the reference signal terminal; and the second output sub-circuit includes a twelfth transistor and a fourth capacitor, and a gate of the twelfth transistor is coupled to the second pull-down node, a first electrode of the twelfth transistor is coupled to the power signal terminal, and a second electrode of the twelfth transistor is coupled to the output signal terminal, and a first electrode of the fourth capacitor is coupled to the second pull-down node, and a second electrode of the fourth capacitor is coupled to the power signal terminal.

For example, the first output sub-circuit further includes a thirteenth transistor and a fourteenth transistor, and the first electrode of the eleventh transistor is coupled to the reference signal terminal through the thirteenth transistor, wherein a gate of the thirteenth transistor is coupled to the second pull-up node, a first electrode of the thirteenth transistor is coupled to the reference signal terminal, and a second electrode of the thirteenth transistor is coupled to the first electrode of the eleventh transistor; and a gate of the fourteenth transistor is coupled to the output signal terminal, a first electrode of the fourteenth transistor is coupled to the power signal terminal, and a second electrode of the fourteenth transistor is coupled to the first electrode of the eleventh transistor.

For example, the shift register unit further includes a third voltage stabilizing circuit. The third voltage stabilizing circuit is coupled to the second pull-up node, the first pull-down node, and the reference signal terminal. The third voltage stabilizing circuit is configured to provide the signal of the reference signal terminal VGL to the second pull-up node under control of the first pull-down node.

For example, the third voltage stabilizing circuit includes an eighteenth transistor. A gate of the eighteenth transistor is coupled to the first pull-down node, a first electrode of the eighteenth transistor is coupled to the reference signal terminal, and a second electrode of the eighteenth transistor is coupled to the second pull-up node.

For example, the shift register unit further includes a fourth voltage stabilizing circuit coupled between the first pull-down node and the second pull-down node and configured to stabilize the potential of the second pull-down node.

For example, the fourth voltage stabilizing circuit includes a nineteenth transistor. A gate of the nineteenth transistor is coupled to the power signal terminal, a first electrode of the nineteenth transistor is coupled to the first pull-down node, and a second electrode of the nineteenth transistor is coupled to the second pull-down node.

For example, the shift register unit further includes a fifth voltage stabilizing circuit coupled to the second pull-down node and configured to stabilize the potential at the second pull-down node.

For example, the fifth voltage stabilizing circuit includes a fifth capacitor, wherein a first electrode of the fifth capacitor is coupled to the first clock signal terminal, and a second electrode of the fifth capacitor is coupled to the second pull-down node; or the fifth voltage stabilizing circuit includes a twentieth transistor and a fifth capacitor, wherein a gate of the twentieth transistor is coupled to a third clock signal terminal of the shift register unit, a first electrode of the twentieth transistor is coupled to the first clock signal terminal, a second electrode of the twentieth transistor is coupled to the first electrode of the fifth capacitor, and a second electrode of the fifth capacitor is coupled to the second pull-down node; or the fifth voltage stabilizing circuit included a sixth capacitor, a fifth capacitor and a twentieth transistor, wherein a gate of the twentieth transistor is coupled to the third clock signal terminal of the shift register unit, a first electrode of the twentieth transistor is coupled to the first clock signal terminal, and a second electrode of the twentieth transistor is coupled to the first electrode of the fifth capacitor, a second electrode of the fifth capacitor is coupled to the second pull-down node, a first electrode of the sixth capacitor is coupled to the second electrode of the twentieth transistor, and a second electrode of the sixth capacitor is coupled to the power signal terminal.

For example, the first control circuit includes the eighth transistor, the ninth transistor, and the tenth transistor, wherein a gate of the eighth transistor is coupled to the first pull-down node, a first electrode of the eighth transistor is coupled to the first clock signal terminal, a second electrode of the eighth transistor is coupled to the first pull-up node, a gate of the ninth transistor is coupled to the first pull-up node, a first electrode of the ninth transistor is coupled to the reference signal terminal, a second electrode of the ninth transistor and a first electrode of the tenth transistor are coupled to the second pull-down node, a second electrode of the tenth transistor is coupled to the second clock signal terminal. The output circuit includes an eleventh transistor, a twelfth transistor, and a fourth capacitor, wherein a gate of the eleventh transistor is coupled to the second pull-up node, a first electrode of the eleventh transistor is coupled to the reference signal terminal, a second electrode of the eleventh transistor is coupled to the output signal terminal, a gate of the twelfth transistor is coupled to the second pull-down node, a first electrode of the twelfth transistor is coupled to the power signal terminal, a second electrode of the twelfth transistor is coupled to the output signal terminal, a first electrode of the fourth capacitor is coupled to the second pull-down node, and a second electrode of the fourth capacitor is coupled to the gate of the tenth transistor. The second control circuit includes a first transmission control sub-circuit and a second transmission control sub-circuit; or the second control circuit includes a first transmission control sub-circuit, a second transmission control sub-circuit, and a third transmission control sub-circuit.

For example, at least one transistor in the input circuit, the first control circuit, the second control circuit, and the output circuit is an N-type transistor.

Embodiments of the present disclosure further provide a display driving circuit including a plurality of cascaded shift register units, wherein the shift register unit is as described above.

Embodiments of the present disclosure further provide a pixel driving circuit, including:

- a driving circuit having a control terminal, a first terminal, and a second terminal, and configured to generate a driving current from the first terminal to the second terminal under control of a signal of the control terminal;
- an input circuit coupled to a data signal terminal and the control terminal of the driving circuit, and configured to provide a data signal at the data signal terminal to the control terminal of the driving circuit under control of a first gate driving signal;
- a compensation circuit coupled to a first voltage terminal, a second voltage terminal, the control terminal of the driving circuit and the second terminal of the driving circuit, and configured to provide a reference voltage at the second voltage terminal to the second terminal of the driving circuit under control of a second gate driving signal, and to provide an initial voltage at the first voltage terminal to the control terminal of the driving circuit under control of a third gate driving signal; and
- a light-emitting control circuit coupled between the first terminal of the driving circuit and a power signal terminal, and configured to couple the first terminal of the driving circuit to the power signal terminal or decouple the first terminal of the driving circuit from the power signal terminal under control of a light-emitting control signal.

For example, the compensation circuit includes a first transistor and a second transistor, wherein a gate of the first transistor is configured to receive the second gate driving signal, a first electrode of the first transistor is coupled to the second voltage terminal, and a second electrode of the first transistor is coupled to the second terminal of the driving circuit; and wherein a gate of the second transistor is configured to receive the third gate driving signal, a first electrode of the second transistor is coupled to the first voltage terminal, and a second electrode of the second transistor is coupled to the control terminal of the driving circuit.

For example, the light-emitting control circuit includes a third transistor, a gate of the third transistor is configured to receive the light-emitting control signal, a first electrode of the third transistor is coupled to the power signal terminal, and a second electrode of the third transistor is coupled to the first terminal of the driving circuit.

For example, the input circuit includes a fourth transistor, a gate of the fourth transistor is configured to receive the first gate driving signal, a first electrode of the fourth transistor is coupled to the data signal terminal, and a second electrode of the fourth transistor is coupled to the control terminal of the driving circuit; and the driving circuit includes a driving transistor and a capacitor, a gate of the driving transistor serves as the control terminal of the driving circuit, a drain of the driving transistor serves as the first terminal of the driving circuit, a source of the driving transistor servers as the second terminal of the driving circuit, a first electrode of the capacitor is coupled to the gate of the driving transistor, and a second electrode of the capacitor is coupled to the second electrode of the driving transistor, a first electrode of the capacitor is coupled to the gate of the driving transistor, and a second electrode of the capacitor is coupled to the second electrode of the driving transistor.

Embodiments of the present disclosure further provide a display panel including at least one display driving circuit as described above and a plurality of sub-pixels arranged in an array, wherein the sub-pixel includes a pixel driving circuit, and the pixel driving circuit includes:

- a driving circuit having a control terminal, a first terminal, and a second terminal, and configured to generate a driving current from the first terminal to the second terminal under control of a signal of the control terminal;

an input circuit coupled to a data signal terminal and the control terminal of the driving circuit, and configured to provide a data signal at the data signal terminal to the control terminal of the driving circuit under control of a first gate driving signal;

a compensation circuit coupled to a first voltage terminal, a second voltage terminal, the control terminal of the driving circuit and the second terminal of the driving circuit, and configured to provide a reference voltage at the second voltage terminal to the second terminal of the driving circuit under control of a second gate driving signal, and to provide an initial voltage at the first voltage terminal to the control terminal of the driving circuit under control of a third gate driving signal; and a light-emitting control circuit coupled between the first terminal of the driving circuit and a power signal terminal, and configured to couple the first terminal of the driving circuit to the power signal terminal or decouple the first terminal of the driving circuit from the power signal terminal under control of a light-emitting control signal, wherein the display driving circuit is configured to provide at least one of the first gate driving signal, the second gate driving signal, the third gate driving signal, and the light-emitting control signal to the plurality of sub-pixels.

Embodiments of the present disclosure further provide a method for controlling the shift register unit as described above, the method including:

in an input phase, providing, by the input circuit, the signal of the input signal terminal and the signal of the power signal terminal to the first pull-up node and the first pull-down node, respectively;

in an output phase, controlling, by the first control circuit, the potential of the first pull-down node based on the potential of the first pull-up node, and controlling the potential of the first pull-up node based on the potential of the first pull-down node; transmitting, by the second control circuit, the signal of the first pull-up node to the second pull-up node and transmitting the signal of the first pull-down node to the second pull-down node, so that one of the second pull-up node and the first pull-up node is at a high level, and the other of the second pull-up node and the first pull-up node is at a low level; and providing, by the output circuit, one of the signal of the power signal terminal and the signal of the reference signal terminal to the output signal terminal under control of the second pull-up node and the second pull-down node; and in a reset phase, controlling, by the first control circuit, the potential of the first pull-down node based on the potential of the first pull-up node, and controlling the potential of the first pull-up node based on the potential of the first pull-down node; transmitting, by the second control circuit, the signal of the first pull-up node to the second pull-up node and the signal of the first pull-down node to the second pull-down node, so that one of the second pull-up node and the first pull-up node is at a high level, and the other of the second pull-up node and the first pull-up node is at a low level; and providing, by the output circuit, the other of the signal of the power signal terminal and the signal of the reference signal terminal to the output signal terminal under control of the second pull-up node and the second pull-down node.

DETAILED DESCRIPTION OF EMBODIMENTS

Although the present disclosure will be fully described with reference to accompanying drawings containing preferred embodiments of the present disclosure, it should be understood that those of ordinary skill in the art can modify the disclosure described herein while obtaining the technical effects of the present disclosure. Therefore, it should be understood that the above description is a broad disclosure for those of ordinary skill in the art, and its content is not intended to limit exemplary embodiments described in the present disclosure.

In addition, in the following detailed description, for the convenience of explanation, many specific details are set forth to provide a comprehensive understanding of embodiments of the present disclosure. However, clearly, one or more embodiments may be implemented without these specific details. In other cases, well-known structures and devices are illustrated to simplify the accompanying drawings.

Figure 1:
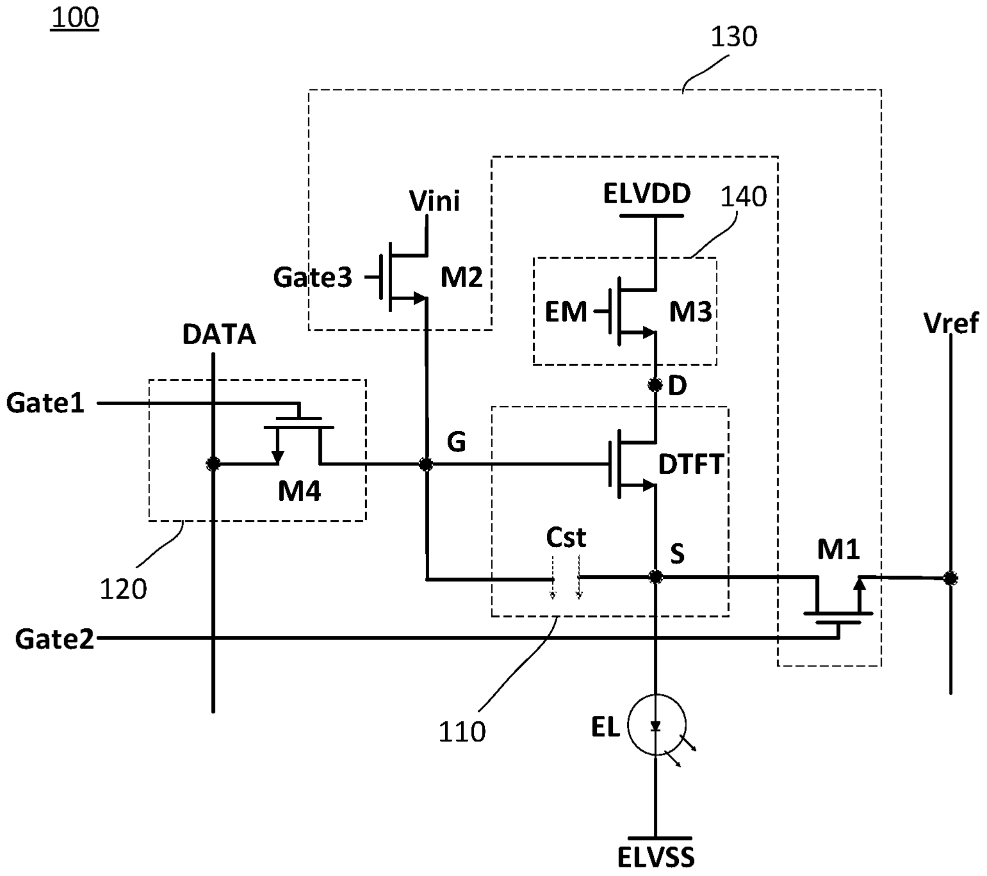
FIG. 1 shows a schematic diagram of a pixel driving circuit according to embodiments of the present disclosure.

FIG. 1 shows a schematic diagram of a pixel driving circuit according to embodiments of the present disclosure.

As shown in FIG. 1, the pixel driving circuit 100 includes a driving circuit 110, a data input circuit 120, a compensation circuit 130, and a light-emitting control circuit 140.

The driving circuit 110 has a control terminal G, a first terminal D, and a second terminal S. The driving circuit 110 is used to generate a driving current from the first terminal D to the second terminal S under control of a signal of the control terminal G. The driving circuit 110 may include a driving transistor DTFT and a capacitor Cst. A gate, drain, and source of the driving transistor DTFT serve as the control terminal G, first terminal D, and second terminal S of the driving circuit, respectively. For ease of description below, the gate, drain, and source of the driving transistor DTFT are also represented by G, D, and S, respectively. A first electrode of the capacitor Cst is coupled to the gate of the driving transistor DTFT, and a second electrode of the capacitor Cst is coupled to the second electrode of the driving transistor DTFT.

The data input circuit 120 is coupled to a data signal terminal DATA and the control terminal G of the driving circuit. The data input circuit 120 may provide a data signal at the data signal terminal DATA to the control terminal G of the driving circuit under control of a first gate driving signal Gate1. The data input circuit 120 may include a fourth transistor M4. The fourth transistor M4 has a gate for receiving the first gate driving signal Gate1, a first electrode coupled to the data signal terminal DATA, and a second electrode coupled to the control terminal G of the driving circuit.

The compensation circuit 130 is coupled to a first voltage terminal Vini, a second voltage terminal Vref, and the control terminal G and second terminal S of the driving circuit. The compensation circuit 130 may provide a reference voltage at the second voltage terminal Vref to the second terminal S of the driving circuit under control of a second gate driving signal Gate2, and an initial voltage at the first voltage terminal Vini to the control terminal G of the driving circuit under control of a third gate driving signal Gate3. The compensation circuit 130 may include a first transistor M1 and a second transistor M2. The first transistor M1 has a gate for receiving the second gate driving signal, a first electrode coupled to the second voltage terminal Vref, and a second electrode coupled to the second terminal S of the driving circuit. The second transistor M2 has a gate for receiving the third gate driving signal, a first electrode coupled to the first voltage terminal Vini, and a second electrode coupled to the control terminal G of the driving circuit.

The light-emitting control circuit 140 is coupled between the first terminal D of the driving circuit and a power signal terminal ELVDD. The light-emitting control circuit 140 may couple or decouple the first terminal D of the driving circuit and the power signal terminal ELVDD under control of the light-emitting control signal EM. The light-emitting control circuit 140 may include a third transistor M3. The third transistor M3 has a gate for receiving the light-emitting control signal EM, a first electrode coupled to the power signal terminal ELVDD, and a second electrode coupled to the first terminal D of the driving circuit.

According to embodiments of the present disclosure, the pixel driving circuit 100 may be included in a sub-pixel and used for driving a light-emitting element in the sub-pixel to emit light. For example, as shown in FIG. 1, the second electrode S of the driving transistor DTFT in the pixel driving circuit 100 may be coupled to a first electrode (such as, an anode) of the light-emitting element EL. A second electrode (such as, a cathode) of the light-emitting element EL may be coupled to a reference signal terminal ELVSS. The light-emitting element EL may be an organic light-emitting diode OLED.

Figure 2:
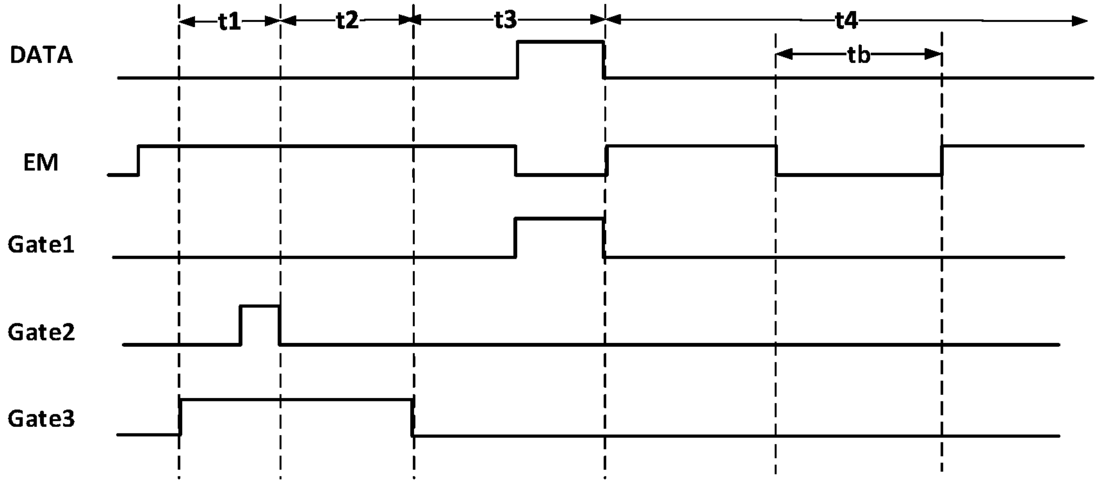
FIG. 2 shows a signal timing diagram of a pixel driving circuit according to embodiments of the present disclosure.

FIG. 2 shows a signal timing diagram of a pixel driving circuit according to embodiments of the present disclosure.

In a period t1, the first gate driving signal Gate1 is at a low level, the second gate driving signal Gate2 and the third gate driving signal Gate3 are at a high level, the fourth transistor M4 is turned off, the first transistor M1 and the second transistor M2 are turned on, so that the gate G of the driving transistor DTFT is reset to be at a first voltage of the first voltage terminal Vini, and the source S of the driving transistor DTFT is reset to be at a second voltage of the second voltage terminal Vref. In this period, the high level of the second gate driving signal Gate2 may arrive later than the high level of the third gate driving signal Gate3, causing the gate G and source S of the driving transistor DTFT to be reset sequentially. Moreover, in this period, the light-emitting control signal EM may be at a high level, so that the drain D of the driving transistor DTFT is reset to be at a reference voltage of the reference signal terminal ELVDD. In this period, the driving transistor DTFT is reset, therefore this period is also referred to as a reset period.

In a period t2, the third gate driving signal Gate3 and the light-emitting control signal EM remain at a high level, and the second gate driving signal Gate2 changes to be at a low level, so that the second transistor M2 and the third transistor M3 remain on and the first transistor M1 is turned off. At this point, a gate-source voltage Vgs of the driving transistor DTFT is greater than a threshold voltage Vth of the driving transistor DTFT. The capacitor Cst charges the source S of the driving transistor DTFT until Vgs=Vth, thereby achieving compensation for the threshold voltage. This period is also referred to as a compensation period. In this period, the light-emitting control signal EM may remain at a high level.

In a period t3, the third gate driving signal Gate3 changes to be at a low level, and thus the second transistor M2 is turned off. Then, the first gate driving signal Gate1 changes to be at a high level, and the light-emitting control signal EM changes to be at a low level, so that the third transistor M3 and the fourth transistor M4 are turned on. Therefore, when the data signal at the data signal terminal DATA arrives, the data signal is written into the gate G of the driving transistor DTFT. As shown in FIG. 2, the data signal at the data signal terminal DATA is shown as a high level. However, those skilled in the art may be aware that this is only to indicate the arrival of the data signal, and the actual level of the data signal depends on the image data, not being a fixed level. In this period, the data signal is written into the gate G of the driving transistor DTFT, therefore this period is also referred as a data writing period.

In a period t4, the light-emitting control signal EM changes to be at a high level, the first gate driving signal Gate1 changes to be at a low level, and the third transistor M3 is turned on. At this point, the first transistor M1, the second transistor M2, and the fourth transistor M4 are all turned off. The driving transistor DTFT generates a driving current from the drain D to the source S under the voltage of the gate G, and the generated driving current drives the light-emitting element EL to emit light. In some embodiments, a black insertion period tb may be provided in the period t4. In the black insertion period, the light-emitting control signal EM is at a low level, and the third transistor M3 is turned off, causing the driving transistor DTFT to stop generating current and the light-emitting element EL to stop emitting light. After the black insertion period tb ends, the light-emitting control signal EM returns to be at a high level, thereby continuing to drive the light-emitting element EL to emit light. In some embodiments, the light-emitting control signal EM may be a multi-pulse signal for low grayscale dimming.

According to embodiments of the present disclosure, a compensation circuit and a light-emitting control circuit are provided in the pixel driving circuit, so that internal compensation may be achieved with lower cost and computational complexity as compared to performing compensation through complex calculations by a source driving circuit with external compensation function.

According to embodiments of the present disclosures, there is also provided a shift register unit capable of generating a scanning signal required for display driving, such as a gate driving signal or a light-emitting control signal, which may be applied to the pixel driving circuit with the internal compensation function or other circuits that require the scanning signal. For example, the generated scanning signal may be applied to the pixel driving circuit in above embodiments. Hereinafter, a detailed illustration of this will be provided with reference to FIGS. 3 to 21.

Figure 3:
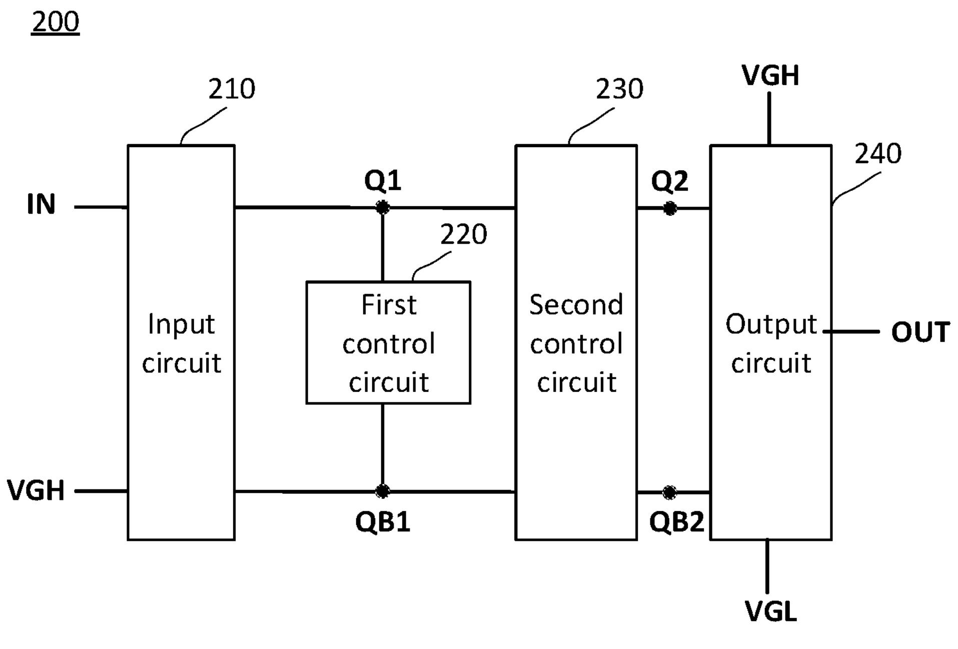
FIG. 3 shows a schematic block diagram of a shift register unit according to embodiments of the present disclosure.

FIG. 3 shows a schematic block diagram of a shift register unit according to embodiments of the present disclosure.

As shown in FIG. 3, the shift register unit 200 includes a signal input circuit 210, a first control circuit 220, a second control circuit 230, and an output circuit 240. The shift register unit 200 may have an input signal terminal IN, an output signal terminal OUT, a power signal terminal VGH, a reference signal terminal VGL, a first pull-up node Q1, a second pull-up node Q2, a first pull-down node QB1, and a second pull-down node QB2.

The signal input circuit 210 is coupled to the input signal terminal IN, the power signal terminal VGH, the first pull-up node Q1, and the first pull-down node QB1. The signal input circuit 210 may provide a signal of the input signal terminal IN and a signal of the power signal terminal VGH to the first pull-up node Q1 and the first pull-down node QB1, respectively. In some embodiments, the signal input circuit 210 may include a first input sub-circuit and a second input sub-circuit. One of the first input sub-circuit and the second input sub-circuit is used to provide one of the signal at the power signal terminal VGH and the signal at the input signal terminal IN to the first pull-up node Q1, while the other of the first input sub-circuit and the second input sub-circuit is used to provide the other of the signal at the power signal terminal VGH and the signal at the input signal terminal IN to the first pull-down node QB1.

The first control circuit 220 couples the first pull-up node Q1 and the first pull-down node QB1. The first control circuit 220 may control a potential of the first pull-down node QB1 based on a potential of the first pull-up node Q1, and control a potential of the first pull-up node Q1 based on a potential of the first pull-down node QB1. In some embodiments, the first control circuit 220 may include a pull-up control sub-circuit and a pull-down control sub-circuit, one of the pull-up control sub-circuit and the pull-down control sub-circuit is used to control the potential of the first pull-down node QB1 based on the potential of the first pull-up node Q1, and the other of the pull-up control sub-circuit and the pull-down control sub-circuit is used to control the potential of the first pull-up node Q1 based on the potential of the first pull-down node QB1.

The second control circuit 230 is coupled to the first pull-up node Q1, the first pull-down node QB1, the second pull-up node Q2, and the second pull-down node QB2. The second control circuit 230 may transmit a signal at the first pull-up node Q1 to the second pull-up node Q2, as well as a signal at the first pull-down node QB1 to the second pull-down node QB2. In some embodiments, the second control circuit 230 may include one or more of a first transmission control sub-circuit, a second transmission control sub-circuit, a third transmission control sub-circuit, and a fourth transmission control sub-circuit. For example, the second control circuit 230 may include the first transmission control sub-circuit and the second transmission control sub-circuit, or include the first to third transmission sub-circuits, or include the first to fourth transmission sub-circuits, which will be illustrated in detail below.

The output circuit 240 is coupled to the second pull-up node Q2, the second pull-down node QB2, the power signal terminal VGH, the reference signal terminal VGL, and the output signal terminal OUT of the shift register unit. The output circuit 240 may provide one of a signal of the power signal terminal VGH and a signal of the reference signal terminal VGL to the output signal terminal OUT under control of the second pull-up node Q2 and the second pull-down node QB2. In some embodiments, the output circuit 240 may include a first output sub-circuit and a second output sub-circuit, one of the first output sub-circuit and the second output sub-circuit is used to provide one of a potential of the power signal terminal and a potential of the reference signal terminal to the output signal terminal under control of the second pull-up node, and the other of the first output sub-circuit and the second output sub-circuit is used to provide the other of the potential of the power signal terminal and the potential of the reference signal terminal to the output signal terminal under control of the second pull-down node.

According to embodiments of the present disclosure, the signal input circuit 210, the first control circuit 220, the second control circuit 230, and the output circuit 240 may each include at least one N-type transistor.

In this way, embodiments of the present disclosure implement a new shift register unit based on N-type transistors. The input circuit, first control circuit, second control circuit, and output circuit cooperate with each other to generate scanning signals required for display driving, such as gate driving signals or light-emitting control signals.

In some embodiments, a first voltage stabilizing circuit may also be provided between the first pull-up node Q1 and the second control circuit 230. The first voltage stabilizing circuit may be coupled with the second control circuit 230 (for example, a control terminal of the first transmission control sub-circuit in the second control circuit 230) at a fourth node. The first voltage stabilizing circuit may be used to stabilize a potential of a fourth pull-up node, which will be illustrated in detail below.

The following will describe multiple examples of the shift register unit according to embodiments of the present disclosure with reference to FIGS. 4 to 21.

Figure 4:
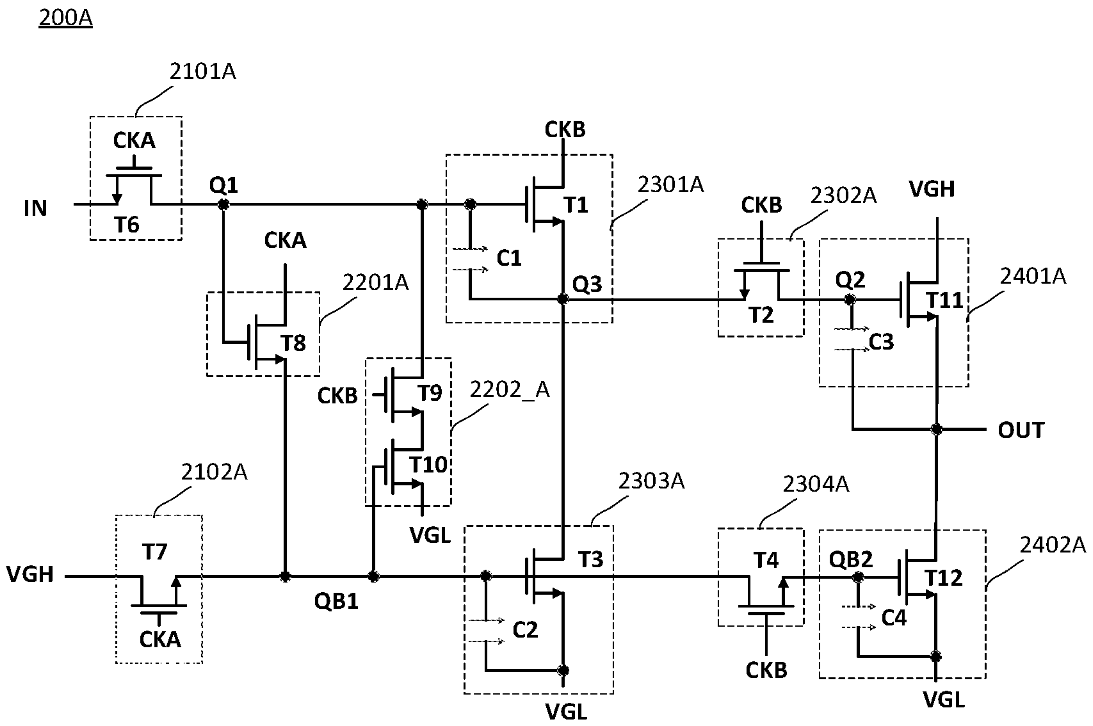
FIGS. 4 to 21 show circuit diagrams of examples of shift register units according to embodiments of the present disclosure, respectively.

FIG. 4 shows a circuit diagram of a shift register unit 200A according to an embodiment of the present disclosure. The shift register unit 200A includes an input circuit, a first control circuit, a second control circuit, and an output circuit. The description of the input circuit, first control circuit, second control circuit, and output circuit in above embodiments is also applicable to the embodiment of FIG. 4.

As shown in FIG. 4, the input circuit includes a first input sub-circuit 2101A and a second input sub-circuit 2102A.

The first input sub-circuit 2101A is coupled to the input signal terminal IN, the first pull-up node Q1, and a first clock signal terminal CKA of the shift register unit. The first input sub-circuit 2101A may provide a signal at the input signal terminal IN to the first pull-up node Q1 under control of the first clock signal terminal CKA. For example, the first input sub-circuit 2101A includes a sixth transistor T6. The sixth transistor T6 has a gate coupled to the first clock signal terminal CKA, a first electrode coupled to the input signal terminal IN, and a second electrode coupled to the first pull-up node Q1.

The second input sub-circuit 2102A is coupled to the power signal terminal VGH, the first pull-down node QB1, and the first clock signal terminal CKA. The second input sub-circuit 2102A may provide a signal at the power signal terminal VGH to the first pull-down node QB1 under control of the first clock signal terminal CKA. The second input sub-circuit 2102A includes a seventh transistor T7. The seventh transistor T7 has a gate coupled to the first clock signal terminal CKA, a first electrode coupled to the power signal terminal VGH, and a second electrode coupled to the first pull-down node QB1.

As shown in FIG. 4, the first control circuit includes a pull-up control sub-circuit 2201A and a pull-down control sub-circuit 2202A.

The pull-up control sub-circuit 2201A is coupled to the first pull-up node Q1, the first pull-down node QB1, and the first clock signal terminal CKA. The pull-up control sub-circuit 2201A may provide a signal at the first clock signal terminal CKA to the first pull-down node QB1 under control of the first pull-up node Q1. For example, the pull-up control sub-circuit 2201A includes an eighth transistor T8. The eighth transistor T8 has a gate coupled to the first pull-up node Q1, a first electrode coupled to the first clock signal terminal CKA, and a second electrode coupled to the first pull-down node QB1.

The pull-down control sub-circuit 2202A is coupled to the first pull-up node Q1, the first pull-down node QB1, the reference signal terminal VGL, and a second clock signal terminal CKB of the shift register unit. The pull-down control sub-circuit 2202A may provide a signal at the reference signal terminal VGL to the first pull-up node Q1 under control of the second clock signal terminal CKB and the first pull-down node QB1. For example, the pull-down control sub-circuit 2202A includes a ninth transistor T9 and a tenth transistor T10. A gate of the ninth transistor T9 is coupled to the second clock signal terminal CKB, a first electrode of the ninth transistor T9 is coupled to a second electrode of the tenth transistor T10, a second electrode of the ninth transistor T9 is coupled to the first pull-up node Q1 or the fourth pull-up node. A gate of the tenth transistor T10 is coupled to the first pull-down node QB1, a first electrode of transistor T10 is coupled to the reference signal terminal VGL.

As shown in FIG. 4, the second control circuit includes a first transmission control sub-circuit 2301A, a second transmission control sub-circuit 2302A, a third transmission control sub-circuit 2303A, and a fourth transmission control sub-circuit 2304A.

The first transmission control sub-circuit 2301A is coupled to the first pull-up node Q1, a third pull-up node of the shift register unit, and the second clock signal terminal CKB. The first transmission control sub-circuit 2301A may provide a signal at the second clock signal terminal CKB to the third pull-up node under control of the first pull-up node Q1. For example, the first transmission control sub-circuit 2301A includes a first transistor T1 and a first capacitor C1. A gate of the first transistor T1 is coupled to the first pull-up node Q1, a first electrode of the first transistor T1 is coupled to the second clock signal terminal CKB, and a second electrode of the first transistor T1 is coupled to the third pull-up node. A first electrode of the first capacitor C1 is coupled to the first pull-up node Q1, and a second electrode of the first capacitor C1 is coupled to the third pull-up node.

The second transmission control sub-circuit 2302A is coupled to the second pull-up node Q2, the third pull-up node Q3, and the second clock signal terminal CKB. The second transmission control sub-circuit 2302A may provide a signal at the third pull-up node to the second pull-up node Q2 under control of the second clock signal terminal CKB. For example, the second transmission control sub-circuit 2302A includes a second transistor T2. A gate of the second transistor T2 is coupled to the second clock signal terminal CKB, a first electrode of the second transistor T2 is coupled to the third pull-up node, and a second electrode of the second transistor T2 is coupled to the second pull-up node Q2.

The third transmission control sub-circuit 2303A is coupled to the first pull-down node QB1, the reference signal terminal VGL, and the third pull-up node Q3. The third transmission control sub-circuit 2303A may provide a signal at the reference signal terminal VGL to the third pull-up node Q3 under control of the first pull-down node QB1. For example, the third transmission control sub-circuit 2303A includes a third transistor T3 and a second capacitor C2. A gate of the third transistor T3 is coupled to the first pull-down node QB1, a first electrode of the third transistor T3 is coupled to the reference signal terminal VGL, a second electrode of the third transistor T3 is coupled to the third pull-up node. A first electrode of the second capacitor C2 is coupled to the first pull-down node QB1, and a second electrode of the second capacitor C2 is coupled to the reference signal terminal VGL.

The fourth transmission control sub-circuit 2304A is coupled to the first pull-down node QB1, the second pull-down node QB2, and the second clock signal terminal CKB. The fourth transmission control sub-circuit 2304A may provide a signal of the first pull-down node QB1 to the second pull-down node QB2 under control of the second clock signal terminal CKB. The fourth transmission control sub-circuit 2304A includes a fourth transistor T4. A gate of the fourth transistor T4 is coupled to the second clock signal terminal CKB, a first electrode of the fourth transistor T4 is coupled to the first pull-down node QB1, and a second electrode of the fourth transistor T4 is coupled to the second pull-down node QB2.

As shown in FIG. 4, the output circuit includes a first output sub-circuit 2401A and a second output sub-circuit 2402A.

The first output sub-circuit 2401A is coupled to one of the power signal terminal VGH and the reference signal terminal VGL, the second pull-up node Q2, and the output signal terminal OUT. The first output sub-circuit 2401A may provide one of a signal of the power signal terminal VGH and a signal of the reference signal terminal VGL to the output signal terminal OUT under control of the second pull-up node Q2. For example, the first output sub-circuit 2401A may include an eleventh transistor T11 and a third capacitor C3. A gate of the eleventh transistor T11 is coupled to the second pull-up node Q2, a first electrode of the eleventh transistor T11 is coupled to the power signal terminal VGH, a second electrode of the eleventh transistor T11 is coupled to the output signal terminal OUT. A first electrode of the third capacitor C3 is coupled to the second pull-up node Q2, and a second electrode of the third capacitor C3 is coupled to the output signal terminal OUT.

The second output sub-circuit 2402A is coupled to the other of the power signal terminal VGH and the reference signal terminal VGL, the second pull-down node QB2, and the output signal terminal OUT. The second output sub-circuit 2402A may provide the other of the signal of the power signal terminal VGH and the signal of the reference signal terminal VGL to the output signal terminal OUT under control of the second pull-down node QB2. For example, the second output sub-circuit 2402A includes a twelfth transistor T12 and a fourth capacitor C4. A gate of the twelfth transistor T12 is coupled to the second pull-down node QB2, a first electrode of the twelfth transistor T12 is coupled to the reference signal terminal VGL, and a second electrode of the twelfth transistor T12 is coupled to the output signal terminal OUT. A first electrode of the fourth capacitor C4 is coupled to the second pull-down node QB2, and a second electrode of the fourth capacitor C4 is coupled to the reference signal terminal VGL.

Figure 5:
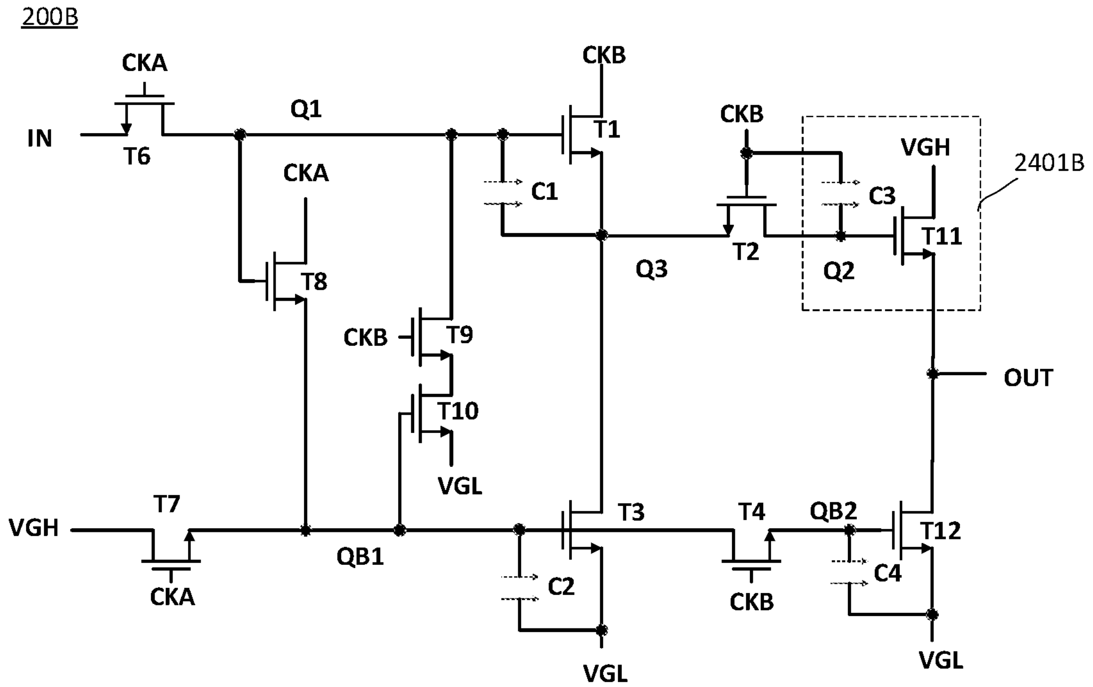

FIG. 5 shows a circuit diagram of a shift register unit 200B according to another embodiment of the present disclosure. The shift register unit 200B shown in FIG. 5 is similar to the shift register unit 200A shown in FIG. 4, except that the connection manner of the third capacitor C3 in the first output sub-circuit is different.

As shown in FIG. 5, the first output sub-circuit 2401B includes an eleventh transistor T11 and a third capacitor C3. A gate of the eleventh transistor T11 is coupled to the second pull-up node Q2, a first electrode of the eleventh transistor T11 is coupled to the power signal terminal VGH, and a second electrode of the eleventh transistor T11 is coupled to the output signal terminal OUT. Unlike that shown in FIG. 4, a first electrode of the third capacitor C3 is coupled to the second pull-up node Q2, and a second electrode of the third capacitor C3 is coupled to the second clock signal terminal CKB.

According to embodiments of the present disclosure, the shift register unit may further include at least one of the first voltage stabilizing circuit and the second voltage stabilizing circuit, which will be illustrated below with reference to FIGS. 6 to 9.

Figure 6:
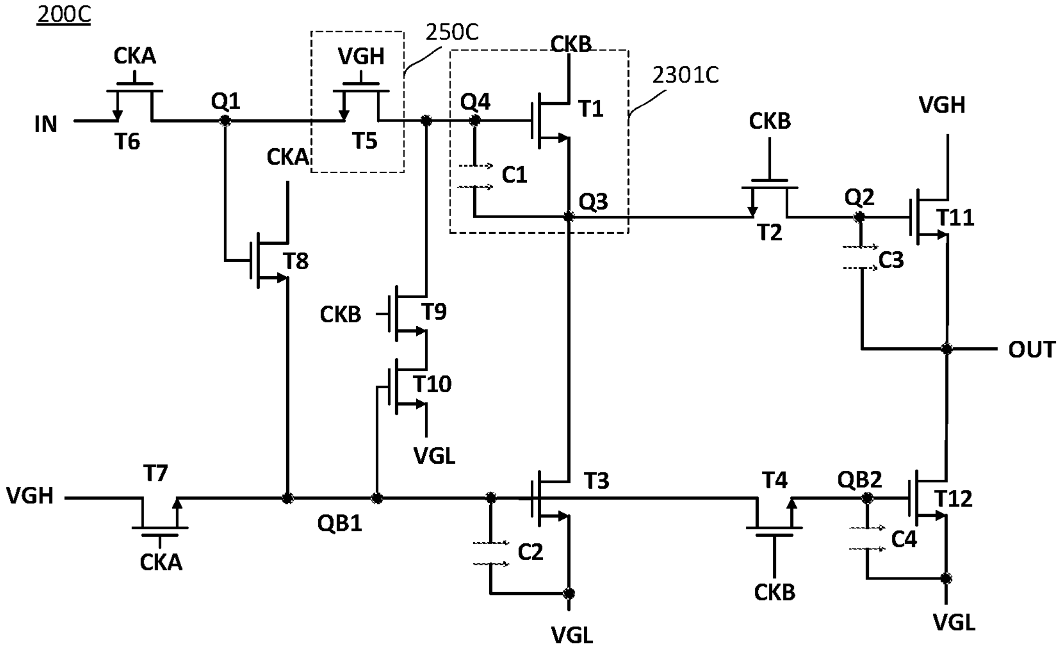

FIG. 6 shows a circuit diagram of a shift register unit 200C according to another embodiment of the present disclosure. The shift register unit 200C shown in FIG. 6 is similar to the shift register unit 200A shown in FIG. 4, except that the shift register unit 200C further includes a first voltage stabilizing circuit.

As shown in FIG. 6, similarly, the shift register unit 200C includes a first voltage stabilizing circuit 250C. The first voltage stabilizing circuit 250C is coupled between the first pull-up node Q1 and the first transmission control sub-circuit 2301C. The first voltage stabilizing circuit 250C is coupled with the first transmission control sub-circuit 2301C at the fourth pull-up node Q4. For example, as shown in FIG. 6, the gate of the first transistor T1 in the first transmission control sub-circuit 2301C is coupled to the fourth pull-up node Q4. As shown in FIG. 6, the first voltage stabilizing circuit 250C may include a fifth transistor T5. A gate of the fifth transistor T5 is coupled to the power signal terminal VGH, a first electrode of the fifth transistor T5 is coupled to the first pull-up node Q1, and a second electrode of the fifth transistor T5 is coupled to the fourth pull-up node Q4. The first voltage stabilizing circuit 250C may stabilize the potential of the fourth pull-up node Q4. For example, when a voltage of the first or second electrode of the fifth transistor T5 is higher than a gate voltage of the fifth transistor T5 (i.e., a voltage of the coupled power signal terminal VGH), the fifth transistor T5 is turned off, thereby preventing the voltage of the fourth node Q4 from being too high and stabilizing the potential of the fourth node Q4.

Figure 7:
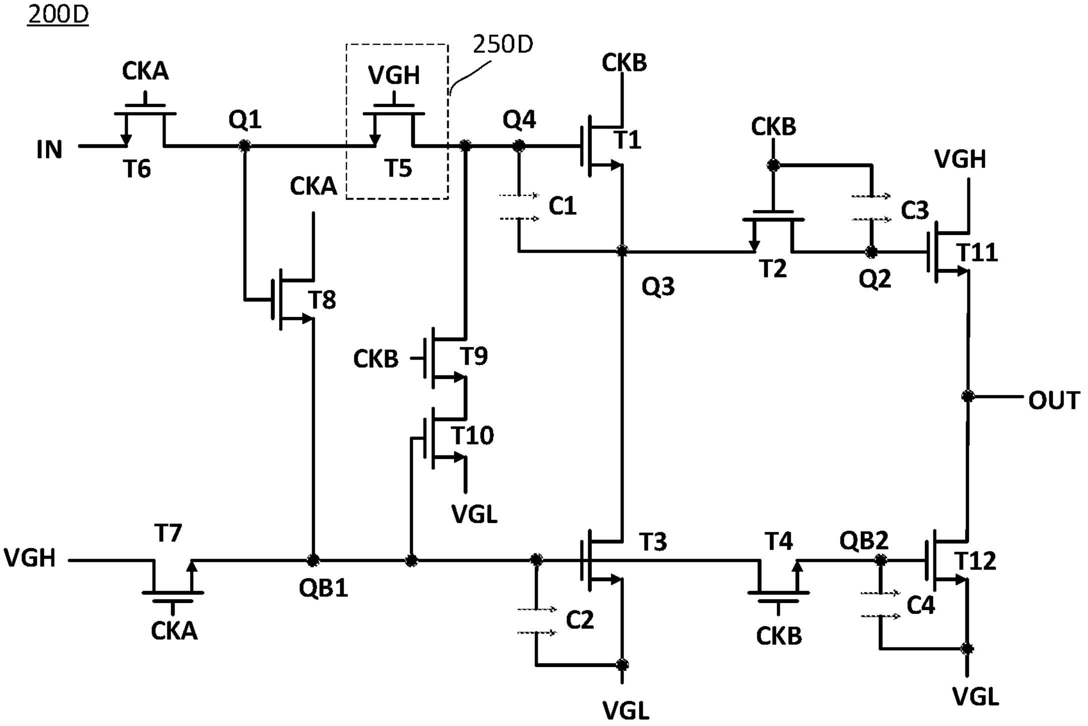

The first voltage stabilizing circuit may be provided in the shift register unit of any of the embodiments of the present disclosure, for example, a first voltage stabilizing circuit 250D may be added in the shift register unit 200B shown in FIG. 5 to obtain a circuit structure shown in FIG. 7.

Figure 8:
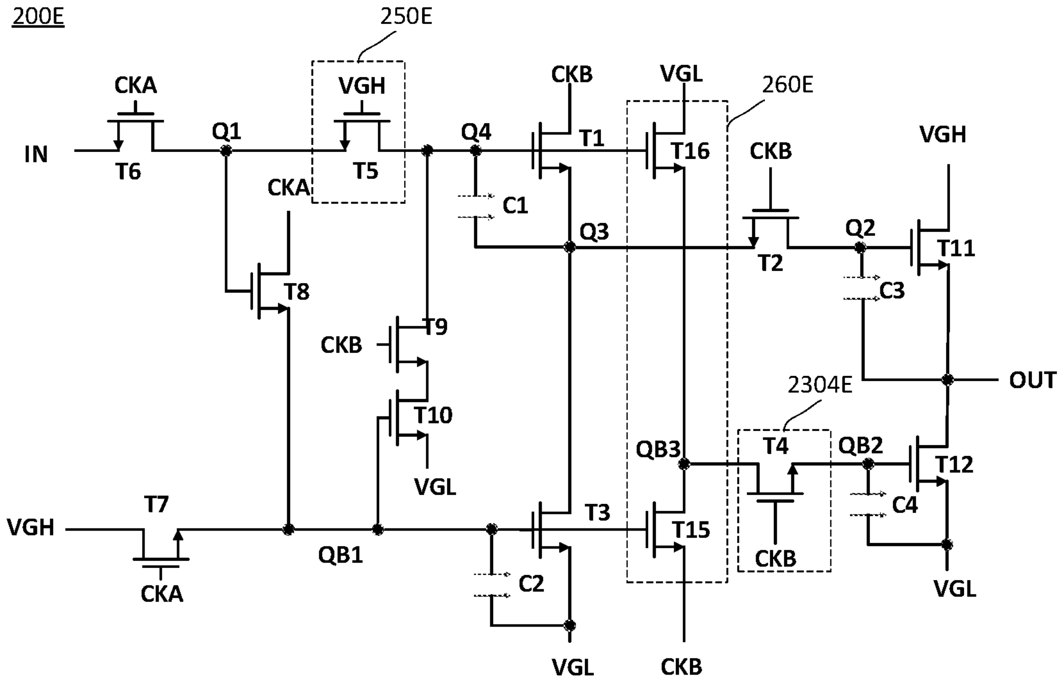

FIG. 8 shows a circuit diagram of a shift register unit 200E according to another embodiment of the present disclosure. The shift register unit 200E shown in FIG. 8 is similar to the shift register unit 200A shown in FIG. 4, except that the shift register unit 200E further includes a first voltage stabilizing circuit and a second voltage stabilizing circuit.

As shown in FIG. 8, the shift register unit 200E includes both a first voltage stabilizing circuit 250E and a second voltage stabilizing circuit 260E. In some embodiments, the shift register unit 200E may include the second voltage stabilizing circuit 260E, without the first voltage stabilizing circuit 250E.

The description of the first voltage stabilizing circuit 250E may refer to any of the above embodiments, and will not be repeated here.

The second voltage stabilizing circuit 260E is coupled between the first pull-down node QB1 and the fourth transmission control sub-circuit 2304E. The second voltage stabilizing circuit 260E is coupled with the fourth transmission control sub-circuit 2304E at the third pull-down node QB3. For example, as shown in FIG. 8, the second voltage stabilizing circuit 260E is coupled with the first electrode of the fourth transistor T4 in the fourth transmission control sub-circuit 2304E at the third pull-down node QB3. The second voltage stabilizing circuit 2304E is used to stabilize the potential of the third pull-down node QB3. For example, the second voltage stabilizing circuit 2304E may include a fifteenth transistor T15 and a sixteenth transistor T16. A gate of the fifteenth transistor T15 is coupled to the first pull-down node QB1, a first electrode of the fifteenth transistor T15 is coupled to the second clock signal terminal CKB, and a second electrode of the fifteenth transistor T15 is coupled to the first electrode of the fourth transistor T4 in the fourth transmission control sub-circuit 2304E at the third pull-down node QB3. A gate of the sixteenth transistor T16 is coupled to the fourth pull-up node Q4 (in the absence of the first voltage stabilizing circuit 250E, coupled to the first pull-up node Q1), a first electrode of the sixteenth transistor T16 is coupled to the reference signal terminal VGL, and a second electrode of the sixteenth transistor T16 is coupled to the third pull-down node QB3.

In embodiments of the present disclosure, by providing the second voltage stabilizing circuit, an additional pull-down node, namely the third pull-down node QB3, is formed between the first pull-down node QB1 and the second pull-down node QB2. The third pull-down node QB3 and the third pull-up node Q3 are both controlled by the potentials of the fourth pull-up node Q4 and the first pull-down node QB1. The third pull-down node QB3 receives the signal of the reference signal terminal VGL when the fourth pull-up node Q4 is at a high level, and receives the signal of the second clock signal terminal CKB when the first pull-down node QB1 is at a high level. On the contrary, the third pull-up node Q3 receives the signal of the second clock signal terminal CKB when the fourth pull-up node Q4 is at a high level, and receives the signal of the reference signal terminal VGL when the first pull-down node QB1 is at a high level. Therefore, the presence of the third pull-down node QB3 and the third pull-up node Q3 further stabilizes the potentials of the second pull-up node Q2 and the second pull-down node QB2, thereby making the output signal of the shift register unit more stable.

Figure 9:
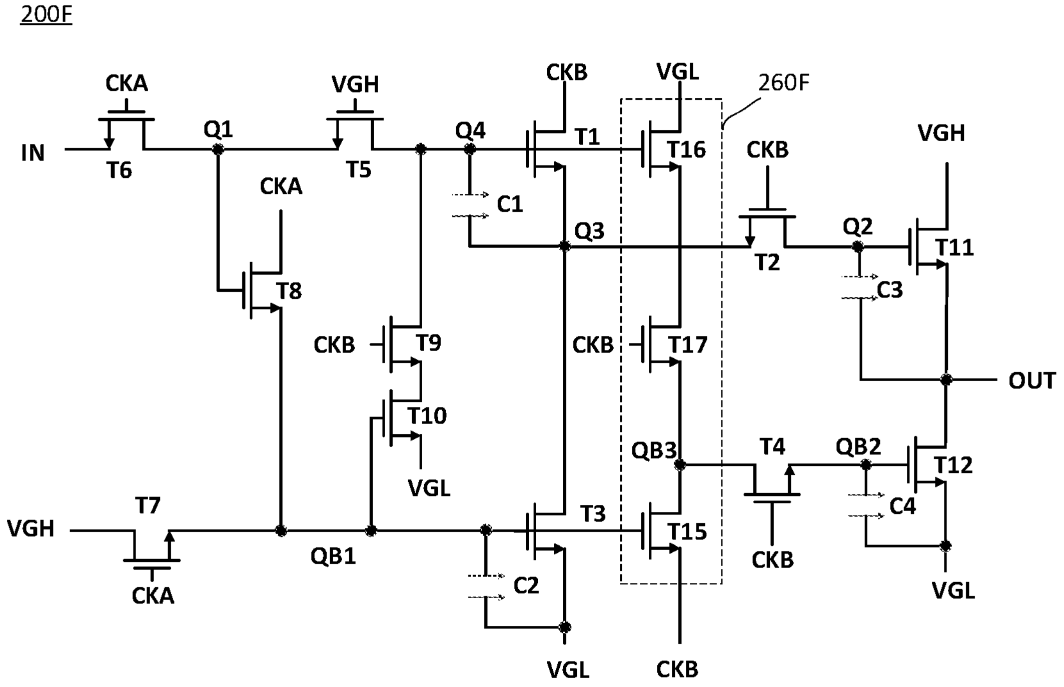

FIG. 9 shows a circuit diagram of a shift register unit 200F according to another embodiment of the present disclosure. The shift register unit 200F shown in FIG. 9 is similar to the shift register unit 200E shown in FIG. 8, except for the structure of the second voltage stabilizing circuit.

As shown in FIG. 9, the second voltage stabilizing circuit 260F includes a seventeenth transistor T17 in addition a fifteenth transistor T15 and a sixteenth transistor T16. A gate of the seventeenth transistor T17 is coupled to the second clock signal terminal CKB, a first electrode of the seventeenth transistor T17 is coupled to the second electrode of the sixteenth transistor T16, and a second electrode of the seventeenth transistor T17 is coupled to the second electrode of the fifteenth transistor T15. The seventeenth transistor T17 serves as an isolation between the fifteenth transistor T15 and the sixteenth transistor T16. For example, when the second clock signal terminal CKB is at a low level, the seventeenth transistor T17 is turned off, so as to isolate the third pull-down node QB3 from the sixteenth transistor T16.

Figure 10:
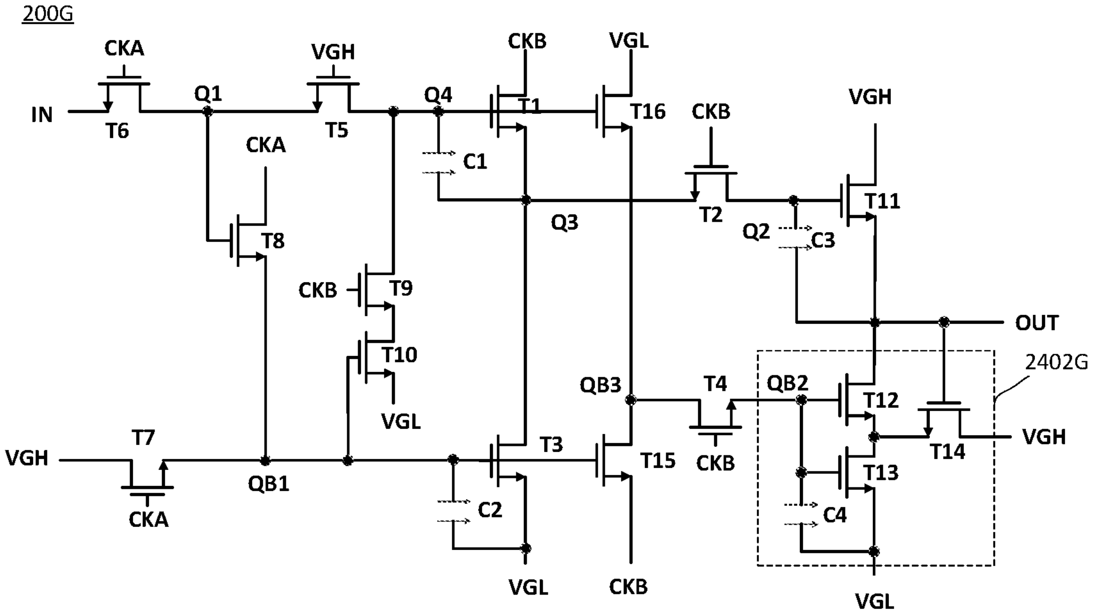
Figure 11:
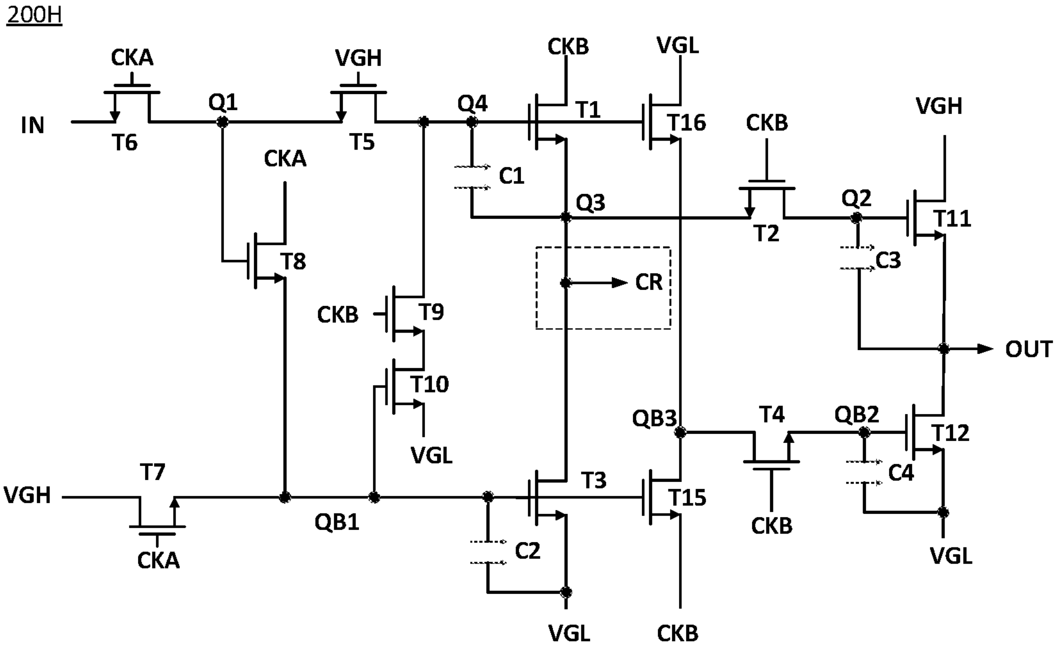

FIG. 10 shows a circuit diagram of a shift register unit 200G according to another embodiment of the present disclosure. The shift register unit 200G shown in FIG. 10 is similar to the shift register unit 200E shown in FIG. 8, except that the structure of the second output sub-circuit is different.

As shown in FIG. 10, the second output sub-circuit 2402G includes a thirteenth transistor T13 and a fourteenth transistor T14 in addition a twelfth transistor T12 and a fourth capacitor C4.

A first electrode of the twelfth transistor T12 is coupled to the reference signal terminal VGL through the thirteenth transistor T13. A gate of the thirteenth transistor T13 is coupled to the second pull-down node QB2, a first electrode of the thirteenth transistor T13 is coupled to the reference signal terminal VGL, and a second electrode of the thirteenth transistor T13 is coupled to the first electrode of the twelfth transistor T12.

A gate of the fourteenth transistor T14 is coupled to the output signal terminal OUT, a first electrode of the fourteenth transistor T14 is coupled to the power signal terminal VGH, and a second electrode of the fourteenth transistor T14 is coupled to the first electrode of the twelfth transistor T12.

The thirteenth transistor T13 and the fourteenth transistor T14 may play a role in preventing leakage. For example, when the output signal terminal OUT is at a high level and the second pull-down node QB2 is at a low level, the twelfth transistor T12 is turned off. If the thirteenth transistor T13 and the fourteenth transistor T14 are not provided, there is a significant voltage difference between the first and second electrodes of the twelfth transistor T12, which may easily lead to leakage. By providing the thirteenth transistor T13 and the fourteenth transistor T14, the thirteenth transistor T13 is turned off and the fourteenth transistor T14 is turned on when the output signal terminal OUT is at a high level and the second pull-down node QB2 is at a low level, so that the first and second electrodes of the twelfth transistor T12 are both at a high level, thus preventing the occurrence of the leakage described above.

According to embodiments of the present disclosures, a plurality of shift register units may be cascaded. The so-called cascading refers to: a signal generated by the output signal terminal OUT of a current stage of a shift register unit is provided as an input signal to the input signal terminal of a subsequent stage of the shift register unit, so that the output signal generated by subsequent stage of the shift register unit is shifted relative to the output signal generated by the current stage of the shift register unit, thereby achieving shift register. In some embodiments, cascading connection is achieved by coupling the output signal terminal OUT of a current stage of the shift register unit to the input signal terminal of a subsequent stage of the shift register unit. In other words, a output signal terminal OUT is coupled to pixels in the display area to provide the output signal for the pixels, and also coupled to another shift register to achieve cascading. In other embodiments, in order to avoid the impact of cascading with another shift register on the output signal, a separate control output terminal may be provided in the shift register unit. The control output terminal is coupled to another shift register to achieve cascading, while the output signal terminal is coupled to pixels in the display area to provide output signal to the pixels. According to embodiments of the present disclosure, the third pull-up node Q3 may be used as the control output terminal of the shift register unit for cascading connections with other shift register units. For example, as shown in the dashed box in FIG. 11, the third pull-up node Q3 may be used as the control output terminal CR of the shift register unit 200H.

In embodiments described above with reference to FIGS. 4 to 11, the shift register unit may generate the gate driving signal required by the pixel driving circuit of embodiments of the present disclosure, such as any of the gate driving signals Gate1, Gate2, and Gate3 shown in FIG. 2.

Figure 12:
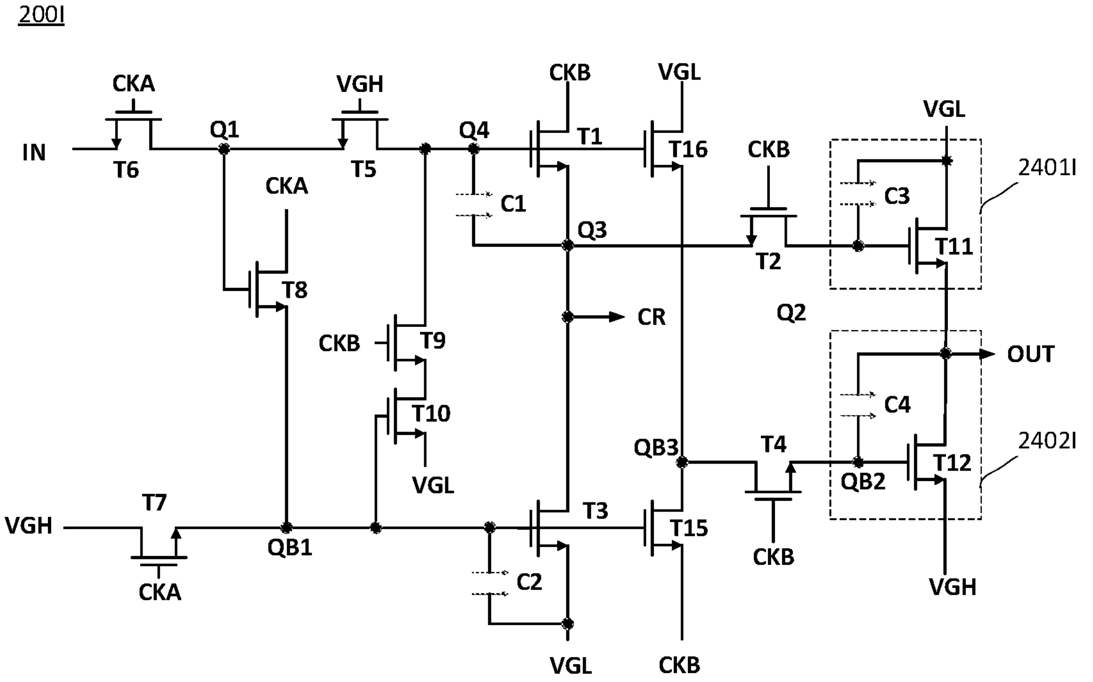

FIG. 12 shows a circuit diagram of a shift register unit 200I according to another embodiment of the present disclosure. The shift register unit 200I shown in FIG. 12 is similar to the shift register unit 200H shown in FIG. 11, except that the first output sub-circuit is coupled to the reference signal terminal VGL, and the second output sub-circuit is coupled to the power signal terminal VGH.

As shown in FIG. 12, the first output sub-circuit 2401I includes an eleventh transistor T11 and a third capacitor C3. A gate of the eleventh transistor T11 is coupled to the second pull-up node Q2, a first electrode of the eleventh transistor T11 is coupled to the reference signal terminal VGL, and a second electrode of the eleventh transistor T11 is coupled to the output signal terminal OUT. A first electrode of the third capacitor C3 is coupled to the second pull-up node Q2, and a second electrode of the third capacitor C3 is coupled to the reference signal terminal VGL.

The second output sub-circuit 2402I includes a twelfth transistor T12 and a fourth capacitor C4. A gate of the twelfth transistor T12 is coupled to the second pull-down node QB2, a first electrode of the twelfth transistor T12 is coupled to the power signal terminal VGH, a second electrode of the twelfth transistor T12 is coupled to the output signal terminal OUT. A first electrode of the fourth capacitor C4 is coupled to the second pull-down node QB2, and a second electrode of the fourth capacitor C4 is coupled to the output signal terminal OUT.

By coupling the first output sub-circuit 2401I to the reference signal terminal VGL, and the second output sub-circuit 2402I to the power signal terminal VGH, the shift register unit may generate a low-level output based on a high-level input, thereby generating the light-emitting control signal required for the pixel driving circuit of embodiments in the present disclosure, such as the light-emitting control signal EM shown in FIG. 2.

Figure 13:
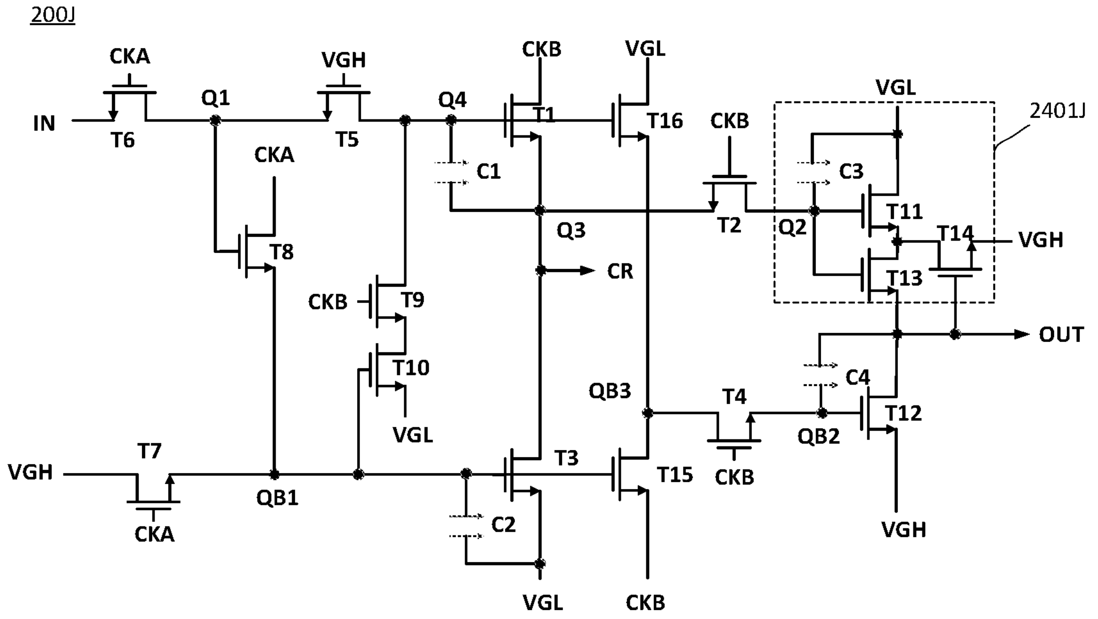

FIG. 13 shows a circuit diagram of a shift register unit 200J according to another embodiment of the present disclosure. The shift register unit 200J shown in FIG. 13 is similar to the shift register unit 200I shown in FIG. 12, except for the structure of the first output sub-circuit.

As shown in FIG. 13, the first output sub-circuit 2401J includes a thirteenth transistor T13 and a fourteenth transistor T14, in addition to a eleventh transistor T11 and a third capacitor C3.

The second electrode of the eleventh transistor T11 is coupled to the output signal terminal OUT through the thirteenth transistor T13. A gate of the thirteenth transistor T13 is coupled to the second pull-up node Q2, a first electrode of the thirteenth transistor T13 is coupled to the second electrode of the eleventh transistor T11, and a second electrode of the thirteenth transistor T13 is coupled to the output signal terminal OUT.

A gate of the fourteenth transistor T14 is coupled to the output signal terminal OUT, a first electrode of the fourteenth transistor T14 is coupled to the power signal terminal VGH, and a second electrode of the fourteenth transistor T14 is coupled to the second electrode of the eleventh transistor T11.

By providing the thirteenth transistor T13 and the fourteenth transistor T14, leakage of the eleventh transistor T11 may be prevented. The principle of preventing leakage by thirteenth transistor T13 and the fourteenth transistor T14 is similar to that of the embodiment described with reference to FIG. 10 above, and will not be repeated here.

In embodiments of the shift register unit described above with reference to FIGS. 4 to 13, the input circuit is positively coupled, that is, the first input sub-circuit is coupled to the input signal terminal IN, and the second input sub-circuit is coupled to the power signal terminal VGH. In this way, when the output circuit is positively coupled (i.e., as shown in FIGS. 4 to 11, the first output sub-circuit is coupled to the power signal terminal VGH and the second output sub-circuit is coupled to the reference signal terminal VGL, the shift register unit may generate the gate driving signal required for the pixel driving circuit. In a case that the output circuit is coupled in a reverse manner (i.e., as shown in FIGS. 12 and 13, the first output sub-circuit is coupled to the reference signal terminal VGL and the second output sub-circuit is coupled to the power signal terminal VGH), the shift register unit may generate the light-emitting driving signal required for the pixel driving circuit.

Embodiments of the present disclosure also provides a shift register unit implemented in the case of reverse coupling of the input circuit, the shift register unit may generate the light-emitting driving signal required by the pixel driving circuit, which will be illustrated below with reference to FIGS. 14 to 21.

Figure 14:
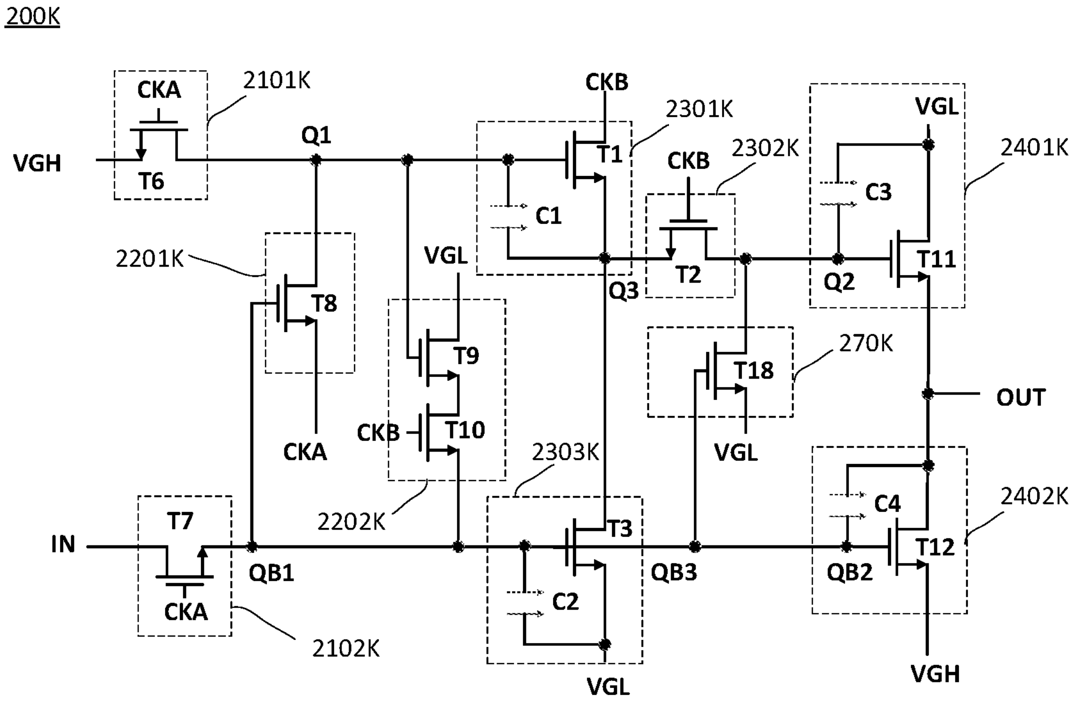

FIG. 14 shows a circuit diagram of a shift register unit 200K according to another embodiment of the present disclosure. The shift register unit 200K shown in FIG. 14 is similar to the shift register unit 200A shown in FIG. 4, except that the input circuit, first control circuit, and output circuit are coupled in a reverse manner, the fourth transmission control sub-circuit is omitted in the second control circuit, and a third voltage stabilizing circuit is added.

As shown in FIG. 14, similarly, the input circuit includes a first input sub-circuit 2101K and a second input sub-circuit 2102K. Unlike that shown in FIG. 4, the first input sub-circuit 2101K is coupled to the power signal terminal VGH, and the second input sub-circuit 2102K is coupled to the input signal terminal IN.

The first input sub-circuit 2101K is coupled to the power signal terminal VGH, the first pull-up node Q1, and the first clock signal terminal CKA. The first input sub-circuit 2101K may provide the signal at the power signal terminal VGH to the first pull-up node Q1 under control of the first clock signal terminal CKA. For example, the first input sub-circuit 2101K includes a sixth transistor T6. A gate of the sixth transistor T6 is coupled to the first clock signal terminal CKA, a first electrode of the sixth transistor T6 is coupled to the power signal terminal VGH, and a second electrode of the sixth transistor T6 is coupled to the first pull-up node Q1.

The second input sub-circuit 2102K is coupled to the input signal terminal IN, the first pull-down node QB1, and the first clock signal terminal CKA. The second input sub-circuit 2102K may provide the signal at the input signal terminal IN to the first pull-down node QB1 under control of the first clock signal terminal CKA. For example, the second input sub-circuit 2102K includes a seventh transistor T7. A gate of the seventh transistor T7 is coupled to the first clock signal terminal CKA, a first electrode of the seventh transistor T7 is coupled to the input signal terminal IN, and a second electrode of the seventh transistor T7 is coupled to the first pull-down node QB1.

As shown in FIG. 14, similarly, the first control circuit includes a pull-up control sub-circuit 2201K and a pull-down control sub-circuit 2202K. Unlike those shown in FIG. 4, the pull-up control sub-circuit 2201K controls the first pull-up node Q1 based on the first pull-down node QB1, while the pull-down control sub-circuit 2202K controls the first pull-down node based on the first pull-up node Q1.

The pull-up control sub-circuit 2201K is coupled to the first pull-up node, the first pull-down node QB1, and the first clock signal terminal CKA. The pull-up control sub-circuit 2201K may provide the signal at the first clock signal terminal CKA to the first pull-up node Q1 under control of the first pull-down node QB1. For example, the pull-up control sub-circuit 2201K includes an eighth transistor T8. A gate of the eighth transistor T8 is coupled to the first pull-down node QB1, a first electrode of the eighth transistor T8 is coupled to the first clock signal terminal CKA, and a second electrode of the eighth transistor T8 is coupled to the first pull-up node Q1.

The pull-down control sub-circuit 2202K is coupled to the first pull-up node Q1, the first pull-down node QB1, the reference signal terminal VGL, and the second clock signal terminal CKB of the shift register unit. The pull-down control sub-circuit 2202K may provide the signal at the reference signal terminal VGL to the first pull-down node QB1 under control of the second clock signal terminal CKB and the first pull-up node Q1. For example, the pull-down control sub-circuit 2202K includes a ninth transistor T9 and a tenth transistor T10. A gate of the ninth transistor T9 is coupled to the first pull-up node Q1, a first electrode of the ninth transistor T9 is coupled to the reference signal terminal VGL, a second electrode of the ninth transistor T9 is coupled to a first electrode of tenth transistor T10. A gate of the tenth transistor T10 is coupled to the second clock signal terminal CKB, and a second electrode of the tenth transistor T10 is coupled to the first pull-down node QB1.

As shown in FIG. 14, similarly, the second control circuit includes a first transmission control sub-circuit 2301K, a second transmission control sub-circuit 2302K, and a third transmission control sub-circuit 2303K. The description of the second control circuit with reference to FIG. 4 above is also applicable to this embodiment, and will not be repeated here.

As shown in FIG. 14, similarly, the output circuit includes a first output sub-circuit 2401K and a second output sub-circuit 2402K. Unlike that shown in FIG. 4, the first output sub-circuit is coupled to the reference signal terminal VGL, and the second output sub-circuit is coupled to the power signal terminal VGH.

The first output sub-circuit 2401K is coupled to the reference signal terminal VGL, the second pull-up node Q2, and the output signal terminal OUT. The first output sub-circuit 2401K may provide the signal of the reference signal terminal VGL to the output signal terminal OUT under control of the second pull-up node Q2. For example, the first output sub-circuit 2401K includes an eleventh transistor T11 and a third capacitor C3. A gate of the eleventh transistor T11 is coupled to the second pull-up node Q2, a first electrode of the eleventh transistor T11 is coupled to the reference signal terminal VGL, and a second electrode of the eleventh transistor T11 is coupled to the output signal terminal OUT. A first electrode of the third capacitor C3 is coupled to the second pull-up node Q2, and a second electrode of the third capacitor C3 is coupled to the reference signal terminal VGL.

The second output sub-circuit 2402K is coupled to the power signal terminal VGH, the second pull-down node QB2, and the output signal terminal OUT. The second output sub-circuit 2402K may provide the signal of the power signal terminal VGH to the output signal terminal OUT under control of the second pull-down node QB2. For example, the second output sub-circuit 2402K includes a twelfth transistor T12 and a fourth capacitor C4. A gate of the twelfth transistor T12 is coupled to the second pull-down node QB2, a first electrode of the twelfth transistor T12 is coupled to the power signal terminal VGH, and a second electrode of the twelfth transistor T12 is coupled to the output signal terminal OUT. A first electrode of the fourth capacitor C4 is coupled to the second pull-down node QB2, and a second electrode of the fourth capacitor C4 is coupled to the output signal terminal OUT.

As shown in FIG. 14, unlike that shown in FIG. 4, the shift register unit 200K further includes a third voltage stabilizing circuit 270K. The third voltage stabilizing circuit 270K is coupled to the second pull-up node Q2, the first pull-down node QB1, and the reference signal terminal VGL. The third voltage stabilizing circuit 270K may provide the signal at the reference signal terminal VGL to the second pull-up node Q2 under control of the first pull-down node QB1. For example, the third voltage stabilizing circuit 270K includes the eighteenth transistor T18. A gate of the eighteenth transistor T18 is coupled to the first pull-down node QB1, a first electrode of the eighteenth transistor T18 is coupled to the reference signal terminal VGL, and a second electrode of the eighteenth transistor T18 is coupled to the second pull-up node Q2. When the third pull-down node QB3 is at a high level, the eighteenth transistor T18 is turned on, so that a low level of the reference signal terminal VGL is provided to the second pull-up node Q2. This ensures that the level of the second pull-up node Q2 is opposite to that of the second pull-down node QB2, which is conducive to the stability of the output signal.

Figure 15:
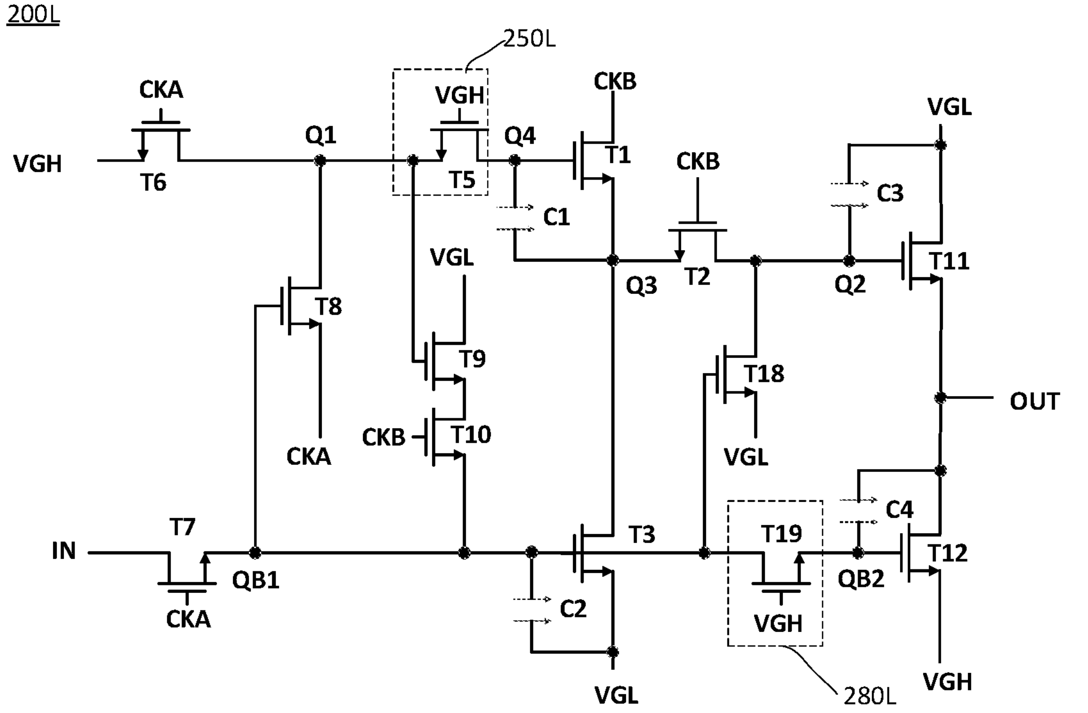

FIG. 15 shows a circuit diagram of a shift register unit 200L according to another embodiment of the present disclosure. The shift register unit 200L shown in FIG. 15 is similar to the shift register unit 200K shown in FIG. 14, except that the shift register unit 200L may further include at least one of the first and fourth voltage stabilizing circuits.

As shown in FIG. 15, the shift register unit 200L includes a first voltage stabilizing circuit 250L and a fourth voltage stabilizing circuit 280L.

The first voltage stabilizing circuit 250L is coupled between the first pull-up node Q1 and the fourth pull-up node Q4 to stabilize the potential of the fourth pull-up node Q4. The description of the first voltage stabilizing circuit in the above embodiments is also applicable to this embodiment, and will not be repeated here.

The fourth voltage stabilizing circuit 280L is coupled between the first pull-down node QB1 and the second pull-down node QB2 to stabilize the potential of the second pull-down node QB2. For example, the fourth voltage stabilizing circuit 280L includes a nineteenth transistor T19. A gate of the nineteenth transistor T19 is coupled to the power signal terminal VGH, a first electrode of the nineteenth transistor T19 is coupled to the first pull-down node QB1, and a second electrode of the nineteenth transistor T19 is coupled to the second pull-down node QB2. The fourth voltage stabilizing circuit 280L plays a role in stabilizing the potential of the second pull-down node QB2, and an operating principle thereof is similar to that of the first voltage stabilizing circuit, which will not be repeated here. By providing both the first and fourth voltage stabilizing circuits, it is possible to ensure the voltage stability of both the pull-up and pull-down nodes, thereby further stabilizing the output signal.

Figure 16:
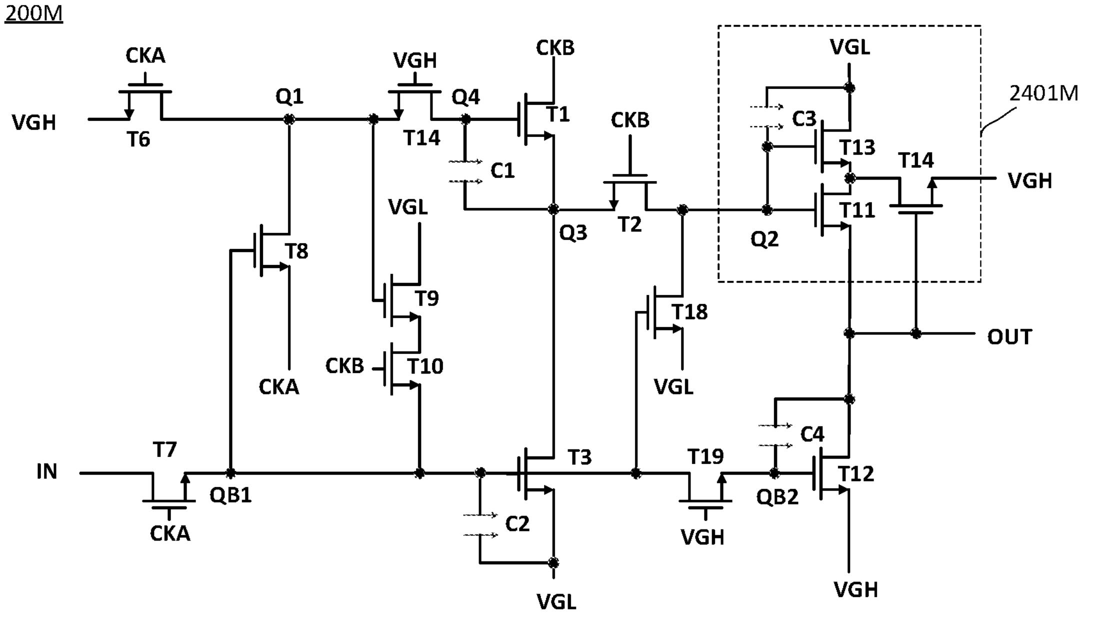

FIG. 16 shows a circuit diagram of a shift register unit 200M according to another embodiment of the present disclosure. The shift register unit 200M shown in FIG. 16 is similar to the shift register unit 200L shown in FIG. 15, except for the structure of the first output sub-circuit.

As shown in FIG. 16, the first output sub-circuit 2401M includes the thirteenth transistor T13 and the fourteenth transistor T14 in addition to an eleventh transistor T11.

A first electrode of the eleventh transistor T11 is coupled to the reference signal terminal VGL through the thirteenth transistor T13. A gate of the thirteenth transistor T13 is coupled to the second pull-up node Q2, a first electrode of the thirteenth transistor T13 is coupled to the reference signal terminal VGL, and a second electrode of the thirteenth transistor T13 is coupled to the first electrode of the eleventh transistor T11.

A gate of the fourteenth transistor T14 is coupled to the output signal terminal OUT, a first electrode of the fourteenth transistor T14 is coupled to the power signal terminal VGH, and a second electrode of the fourteenth transistor T14 is coupled to the first electrode of the eleventh transistor T11.

The thirteenth transistor T13 and the fourteenth transistor T14 may play a role in preventing leakage from the eleventh transistor T11, and an operating principle thereof is similar to the embodiment described with reference to FIG. 10 above, and will not be repeated here.

Figure 17:
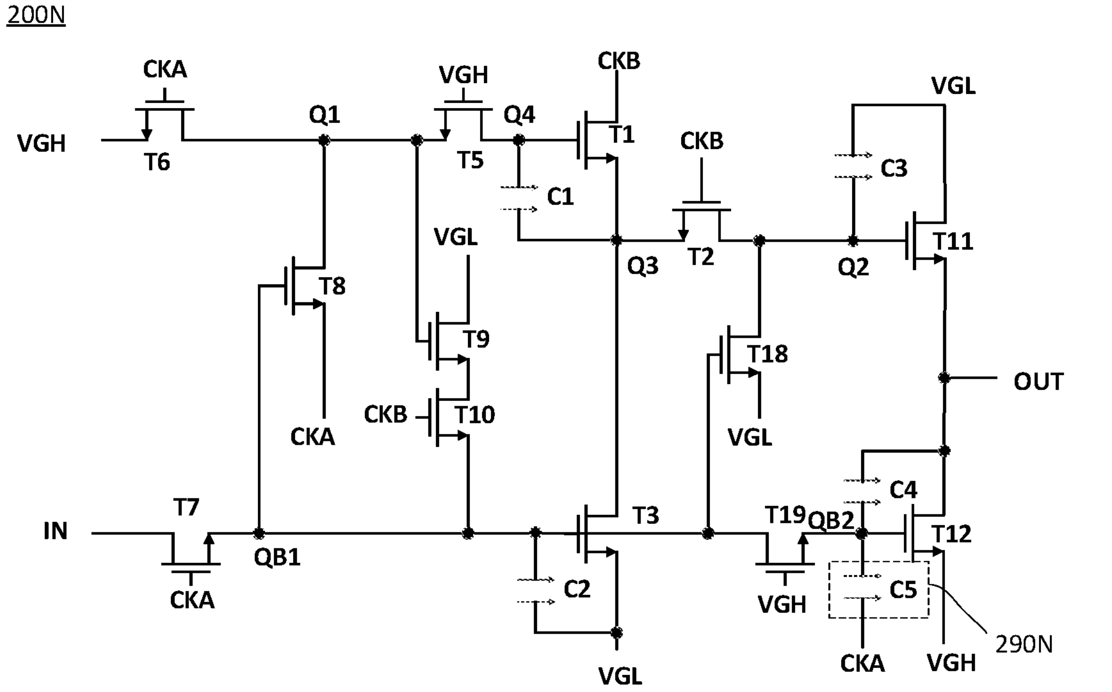
Figure 18:
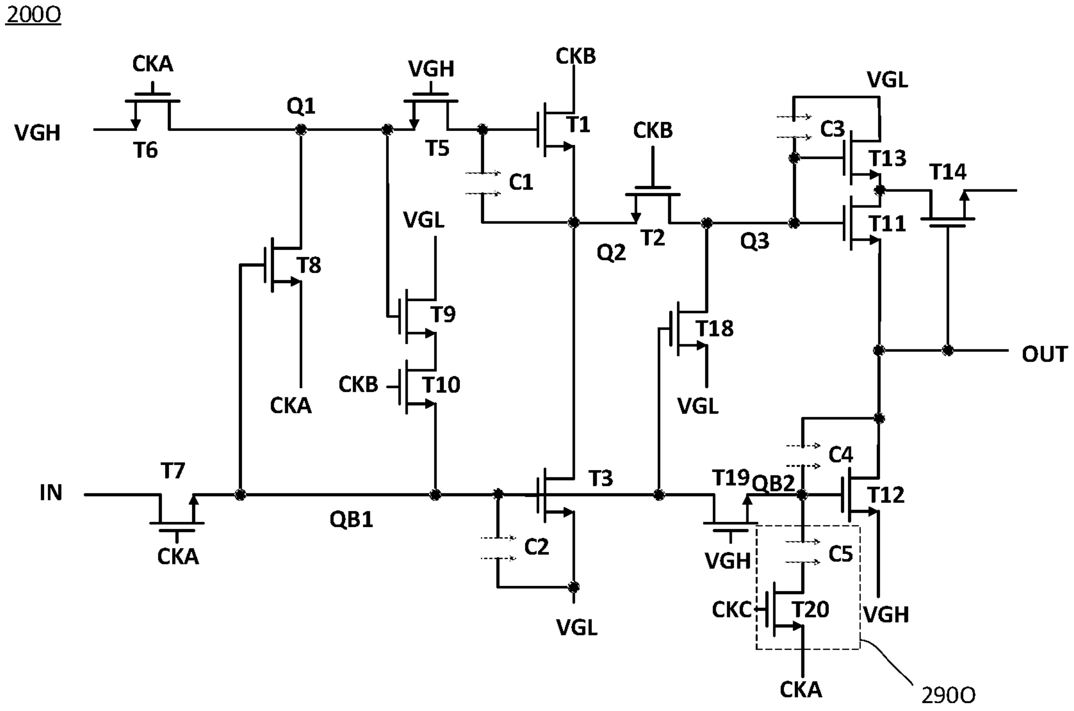
Figure 19:
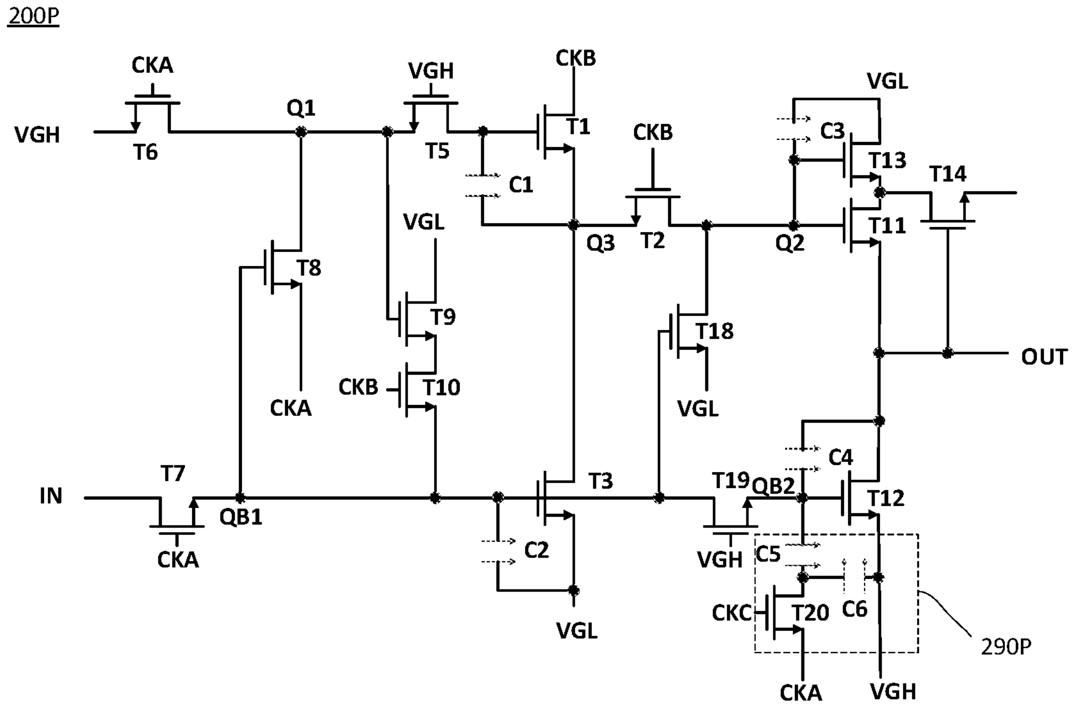

FIGS. 17 to 19 show circuit diagrams of shift register units according to embodiments of the present disclosure. The shift register units in these embodiments are similar to the shift register unit 200M shown in FIG. 16, except that these shift register units further include a fifth voltage stabilizing circuit.

As shown in FIG. 17, the shift register unit 200N includes a fifth voltage stabilizing circuit 290N. The fifth voltage stabilizing circuit 290N is coupled to the second pull-down node QB2 to stabilize the potential at the second pull-down node QB2. In the example shown in FIG. 17, the fifth voltage stabilizing circuit 290N includes a fifth capacitor C5. A first electrode of the fifth capacitor C5 is coupled to the first clock signal terminal CKA, and a second electrode of the fifth capacitor C5 is coupled to the second pull-down node QB2.

When the first clock signal terminal CKA is at a high level and the input signal terminal IN is at a low level, the transistors T7, T3, and T19 are turned on, and the second pull-down node QB2 is at a high level. At this point, one terminal of the fifth capacitor C5 is at a high level and the other terminal of the fifth capacitor C5 is at a low level. The bootstrap effect of the capacitor increases the potential of the second pull-down node QB2, ensuring that the twelfth transistor T12 continuously outputs the high level of the power signal terminal VGH to the output signal terminal OUT.

According to embodiments of the present disclosure, the fifth voltage stabilizing circuit may be implemented in other manners.

For example, in the example shown in FIG. 18, the fifth voltage stabilizing circuit 290Q may include a twentieth transistor T20 in addition to the fifth capacitor C5. A gate of the twentieth transistor T20 is coupled to a third clock signal terminal CKC of the shift register unit, a first electrode of the twentieth transistor T20 is coupled to the first clock signal terminal CKA, a second electrode of the twentieth transistor T20 is coupled to the first electrode of the fifth capacitor C5, and the second electrode of the fifth capacitor C5 is coupled to the second pull-down node QB2. By providing the twentieth transistor T20, the floating of the fifth capacitor C5 is avoided. For example, a valid level of a clock signal of the third clock signal terminal CKC may partially overlap with a valid level of a clock signal of the first clock signal terminal CKA, so that the twentieth transistor T20 only collects at a rising edge of the first clock signal at the first clock signal terminal CKA, thereby raising the potential of the second pull-down node QB2.

For example, in the example shown in FIG. 19, the fifth voltage stabilizing circuit 290P may include a sixth capacitor C6 in addition to the fifth capacitor C5 and the twentieth transistor T20. The gate of the twentieth transistor T20 is coupled to the third clock signal terminal CKC of the shift register unit, the first electrode of the twentieth transistor T20 is coupled to the first clock signal terminal CKA, the second electrode of the twentieth transistor T20 is coupled to the first electrode of the fifth capacitor C5, and the second electrode of the fifth capacitor C5 is coupled to the second pull-down node QB2. A first electrode of the sixth capacitor C6 is coupled to the second electrode of the twentieth transistor T20, and a second electrode of the sixth capacitor C6 is coupled to the power signal terminal VGH. By providing the sixth capacitor C6, it is possible to prevent the fifth capacitor C5 from floating when the twentieth transistor T20 is turned off.

Figure 20:
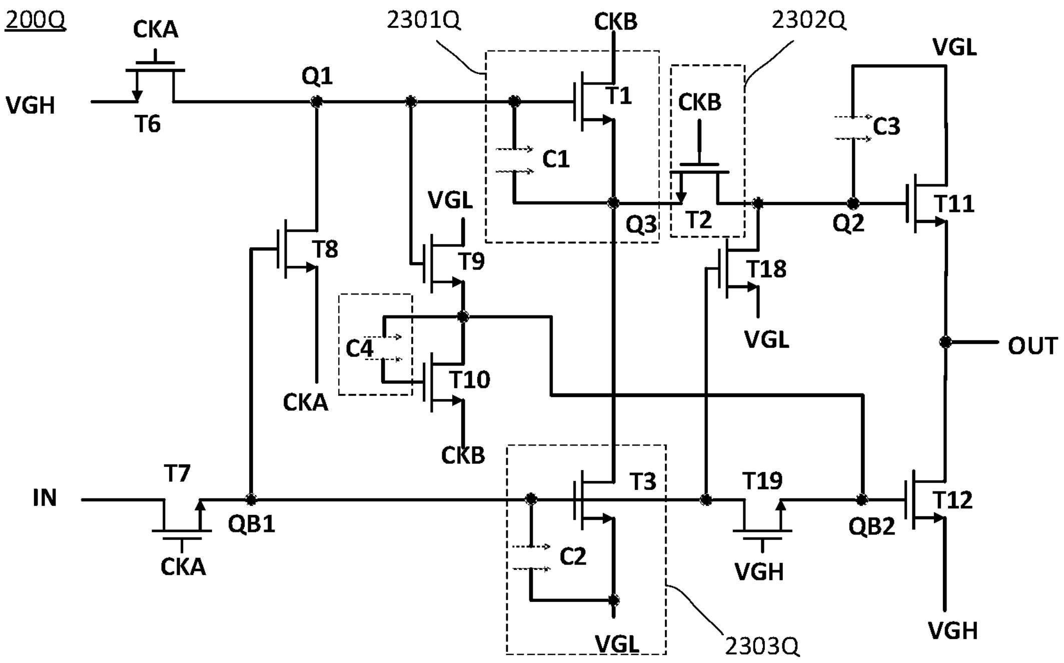

FIG. 20 shows a circuit diagram of a shift register unit 200Q according to another embodiment of the present disclosure. The shift register unit 200Q shown in FIG. 20 is similar to the shift register unit 200K shown in FIG. 14, except that the structure of the first control circuit and the output circuit is different.

As shown in FIG. 20, similar to that shown in FIG. 14, the first control circuit includes the eighth transistor T8, the ninth transistor T9, and the tenth transistor T10. The output circuit includes the eleventh transistor T11, the twelfth transistor T12, and the fourth capacitor T4. The second control circuit includes a first transmission control sub-circuit 2301Q, a second transmission control sub-circuit 2302Q, and a third transmission control sub-circuit 2303Q. Unlike that shown in FIG. 14, in the shift register unit 200Q, a second electrode of the ninth transistor T9 and a first electrode of the tenth transistor T10 are both coupled to the second pull-down node QB2, a gate of the tenth transistor T10 is coupled to the fourth capacitor C4 in the output circuit, and a second electrode of the tenth transistor T10 is coupled to the second clock signal terminal CKB. In addition, unlike that shown in FIG. 14, in the shift register unit 200Q, the fourth capacitor C4 is not coupled between the second pull-down node QB2 and the output signal terminal OUT. Instead, a first electrode of the fourth capacitor C4 is coupled to the second pull-down node QB2, the second electrode of the ninth transistor T9, and the first electrode of the tenth transistor T10. A second electrode of the fourth capacitor C4 is coupled to the gate of the tenth transistor T10. In this way, the first control circuit and the output circuit share the fourth capacitor C4, which has both a function of storing charges in the output circuit and a function of controlling the potential of the first pull-up node Q1 in the first control circuit. This greatly simplifies the structure of the circuit.

Figure 21:
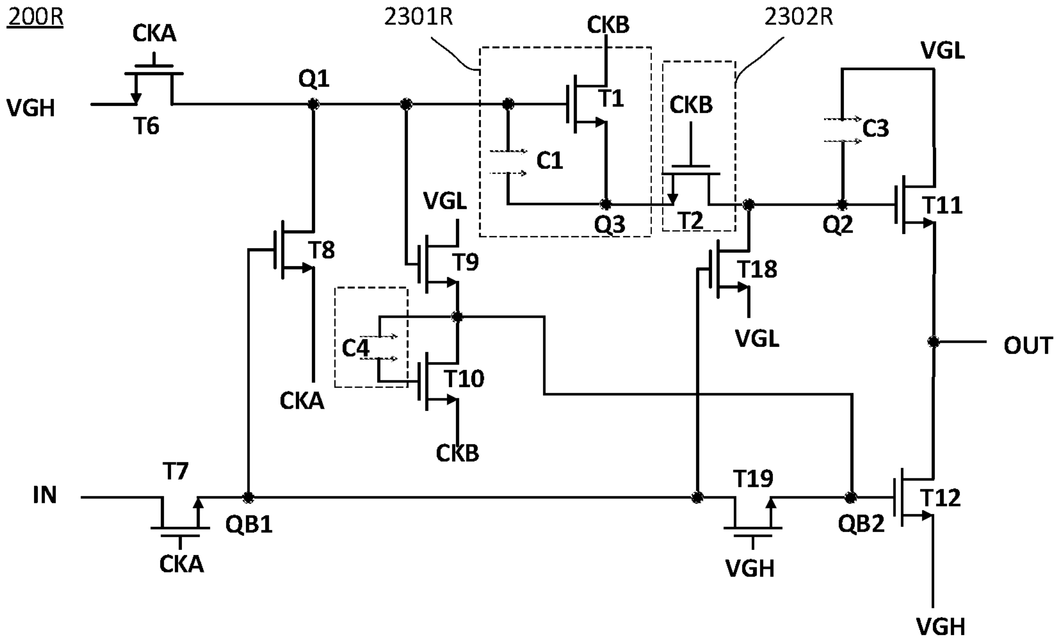

FIG. 21 shows a circuit diagram of a shift register unit 200R according to another embodiment of the present disclosure. The shift register unit 200R shown in FIG. 21 is similar to the shift register unit 200Q shown in FIG. 20, except that the third transmission control sub-circuit is omitted.

As shown in FIG. 21, the second control circuit of the shift register unit 200R includes a first transmission control sub-circuit 2031R and a second transmission control sub-circuit 2032R. As compared to FIG. 20, the third transmission control sub-circuit 2303Q is omitted. The above description of the first transmission control sub-circuit and the second transmission control sub-circuit also applies to this embodiment. It can be seen that by omitting the third transmission control sub-circuit, the circuit structure is further simplified.

Figure 22:
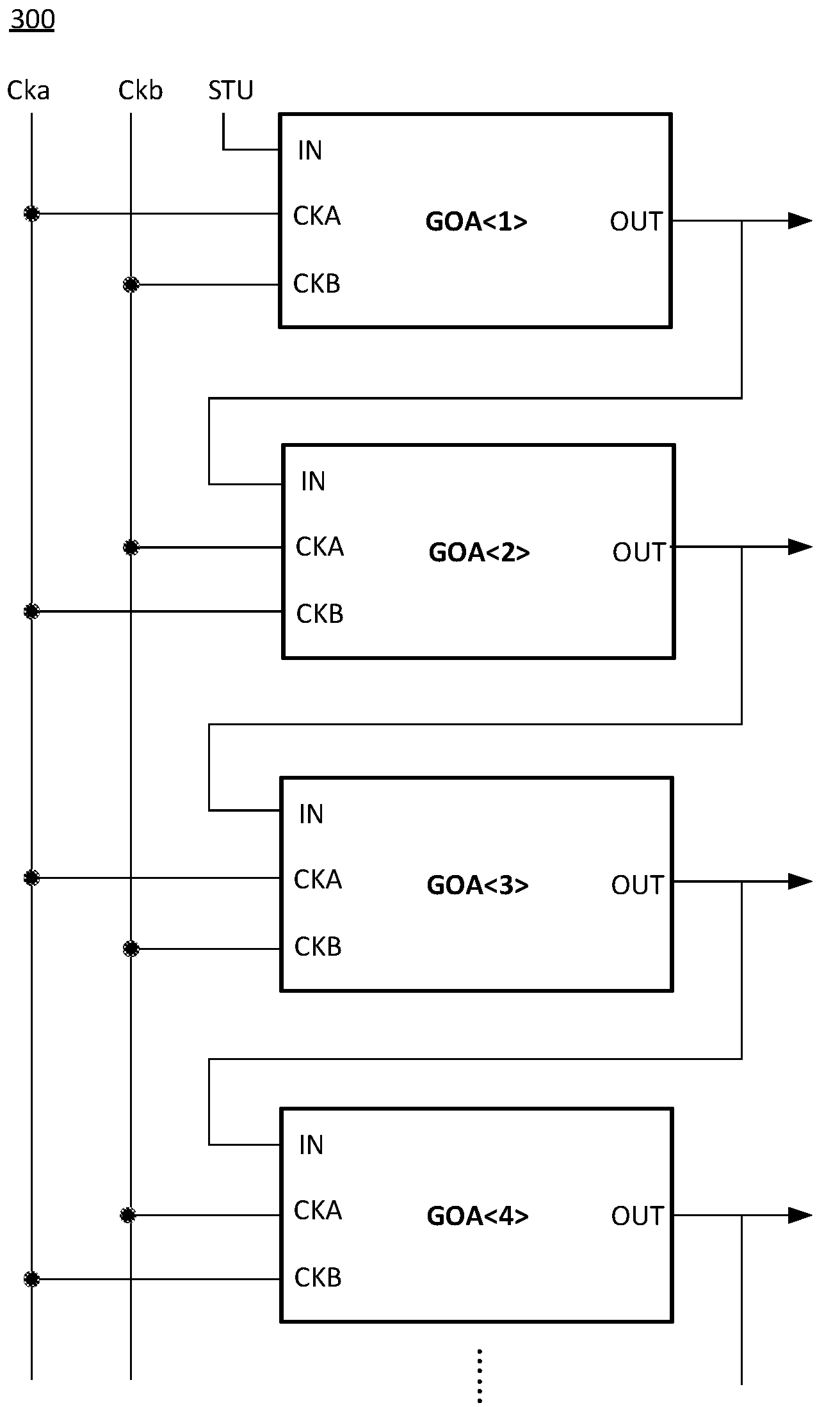
FIG. 22 shows a schematic block diagram of a display driving circuit according to embodiments of the present disclosure.

FIG. 22 shows a schematic block diagram of a display driving circuit according to embodiments of the present disclosure.

As shown in FIG. 22, the display driving circuit 300 may include a plurality of cascaded shift register units GOA<1>, GOA<2>, GOA<3>, GOA<4>, etc. At least one of these shift register units may be implemented by the shift register unit of any of the above embodiments.

As shown in FIG. 22, the output signal terminal of each stage of shift register unit is coupled to the input signal terminal of a next stage of shift register unit of the stage of shift register unit. For example, the output signal terminal OUT of the first stage of shift register unit GOA<1> is coupled to the input signal terminal IN of the second stage of shift register unit GOA<2>, the output signal terminal OUT of the second stage of shift register unit GOA<2> is coupled to the input signal terminal IN of the third stage of shift register unit GOA<3>, and so on. However, embodiments of the present disclosures are not limited to this. The output signal terminal of the $n^{th}$ stage of shift register unit may be coupled to the input signal terminal of the $(n+i)^{th}$ stage of shift register unit, where i may be set as desired. Embodiments of the present disclosures are not limited to this. The input signal terminal IN of the first stage of shift register unit GOA<1> receives a start signal STU, and a waveform of the start signal determines a waveform of the output signal at the output signal terminal OUT. In other words, by adjusting a pulse width of the start signal, a pulse width of the output signal may be adjusted, thereby achieving pulse width modulation output.

As shown in FIG. 22, the first clock signal terminals CKA of the odd-numbered stages of shift register units (such as GOA<1>, GOA<3>, . . . ) are coupled to receive a first clock signal Cka, and the second clock signal terminals CKB of the odd-numbered stages of shift register units (such as GOA<1>, GOA<3>, . . . ) are coupled to receive a second clock signal Ckb. On the contrary, the first clock signal terminals CKA of the even-numbered stages of shift register units (such as GOA<2>, GOA<4>, . . . ) are coupled to receive the second clock signal Ckb, and the second clock signal terminals CKB of the even-numbered stages of shift register units (such as GOA<2>, GOA<4>, . . . ) are coupled to receive the first clock signal Cka. However, embodiments of the present disclosures are not limited to this, and the clock coupling methods of the odd-numbered stages and the even-numbered stages may be interchanged, which will not be repeated here.

As shown in FIG. 22, the output signal terminal OUT of each shift register unit is used to cascade with another shift register unit and also used to provide a scanning signal to sub-pixels in the display area. However, embodiments of the present disclosures are not limited to this. In a case that a separate control output terminal CR is provided in the shift register unit, the control output terminal CR may be used for the cascade coupling, and the output signal terminal OUT may be used to provide the scanning signal to the sub-pixels in the display area.

The display driving circuit 300 may be used to provide gate driving signals or to provide light-emitting control signals, which depends on the structure of the shift register units contained therein. For example, when the shift register units in the display driving circuit 300 are implemented by embodiments described above with reference to FIGS. 4 to 11, the display driving circuit 300 may serve as a gate driving circuit to provide a gate driving signal. When the shift register units in the display driving circuit 300 are implemented by embodiments described above with reference to FIGS. 12 to 21, the display driving circuit 300 may be used as a light-emitting driving circuit to provide a light-emitting control signal.

In any embodiments of the shift register units described above, at least one transistor may be an N-type film transistor. In some embodiments, transistors T1 to T20 as described above may all be N-type transistors, such as N-type thin film transistors. Thus, embodiments of the present disclosure implement the shift register units based on an N-type transistor.

Embodiments of the present disclosure further provide a display panel. The display panel may include the display driving circuit of any of the above embodiments and the pixel driving circuit of any of the above embodiments. Hereinafter, a detailed illustration of this will be provided with reference to FIG. 23.

Figure 23:
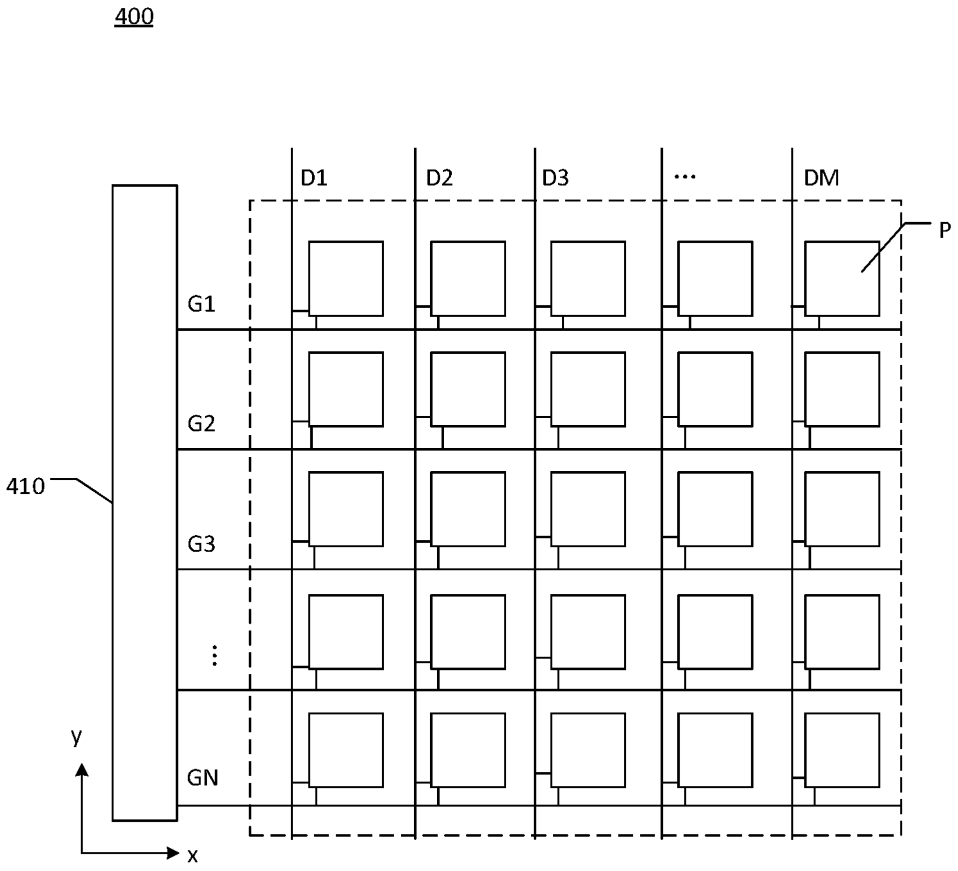
FIG. 23 shows a schematic diagram of a display panel according to embodiments of the present disclosure.

FIG. 23 shows a schematic diagram of a display panel according to embodiments of the present disclosure.

As shown in FIG. 23, the display panel 400 includes a display driving circuit 410 and a plurality of sub-pixels P arranged in an array. The sub-pixel P includes a pixel driving circuit, such as the pixel driving circuit 100 described above with reference to FIG. 1.

The display panel 400 may include one or more display driving circuits 410, for example, one serving as the gate driving circuit to provide the gate driving signal, and another serving as the light-emitting driving circuit to provide the light-emitting control signal. For the pixel driving circuit 100 described above, three gate driving circuits and one light-emitting driving circuit may be provided to provide gate driving signals Gate1 to Gate3 and a light-emitting control signal EM, respectively. At least one display driving circuit 410 may be implemented by the display driving circuit according to embodiments of the present disclosure.

As shown in FIG. 23, the plurality of sub-pixels P are arranged in an N×M array, where N and M are integers greater than 1. The display driving circuit may provide scanning signals to N rows of sub-pixels through a plurality of scanning signal lines extending in the first direction (x direction in FIG. 1). By using a single display driving circuit as an example, the display driving circuit 410 is coupled to the plurality of sub-pixels P, and may be coupled to N rows of sub-pixels respectively through the plurality of scanning signal lines extending in the first direction (x direction in FIG. 1). For example, the display driving circuit 410 is coupled to a first row of sub-pixels P through, for example, a first scanning signal line to provide a first scanning signal G1 to the first row of sub-pixels P, the display driving circuit 410 is coupled to a second row of sub-pixels P through, for example, a second scanning signal line to provide a second scanning signal G2 to the second row of sub-pixels P, and so on. In some embodiments, the gate driving circuit 10 may scan N rows of sub-pixels P one by one or multiple rows, or scan the N rows of sub-pixels P at intervals of one or more rows. Embodiments of the present disclosures are not limited to this. When the display driving circuit 410 is implemented as the gate driving circuit, the scanning signal is the gate driving signal. When the display driving circuit 410 is implemented as the light-emitting driving circuit, the scanning signal is the light-emitting control signal. A plurality of data lines D1, D2, . . . , DM extending in the second direction (y direction in FIG. 1), DM may be used to provide data signals to M columns of sub-pixels P, thereby achieving image display.

Embodiments of the present disclosure further provide a method for controlling a shift register unit, which is applicable to any shift register unit of the above embodiments.

In an input phase, the input circuit provides the signal of the input signal terminal and the signal of the power signal terminal to the first pull-up node and the first pull-down node, respectively.

In an output phase, the first control circuit controls the potential of the first pull-down node based on the potential of the first pull-up node, and controls the potential of the first pull-up node based on the potential of the first pull-down node. The second control circuit transmits the signal at the first pull-up node to the second pull-up node and the signal at the first pull-down node to the second pull-down node, so that one of the second pull-up node and the first pull-up node is at a high level, and the other of the second pull-up node and the first pull-up node is at a low level. The output circuit provides one of the signal of the power signal terminal and the signal of the reference signal terminal to the output signal terminal under control of the second pull-up node and the second pull-down node.

In a reset phase, the first control circuit controls the potential of the first pull-down node based on the potential of the first pull-up node, and controls the potential of the first pull-up node based on the potential of the first pull-down node. The second control circuit transmits the signal at the first pull-up node to the second pull-up node and the signal at the first pull-down node to the second pull-down node, so that one of the second pull-up node and the first pull-up node is at a high level, and the other of the second pull-up node and the first pull-up node is at a low level. The output circuit provides the other of the signal of the power signal terminal and the signal of the reference signal terminal to the output signal terminal under control of the second pull-up node and the second pull-down node.

Hereinafter, an illustration of the control method according to embodiments of the present disclosure will be provided with reference to signal timings shown in FIGS. 24 to 26.

Figure 24:
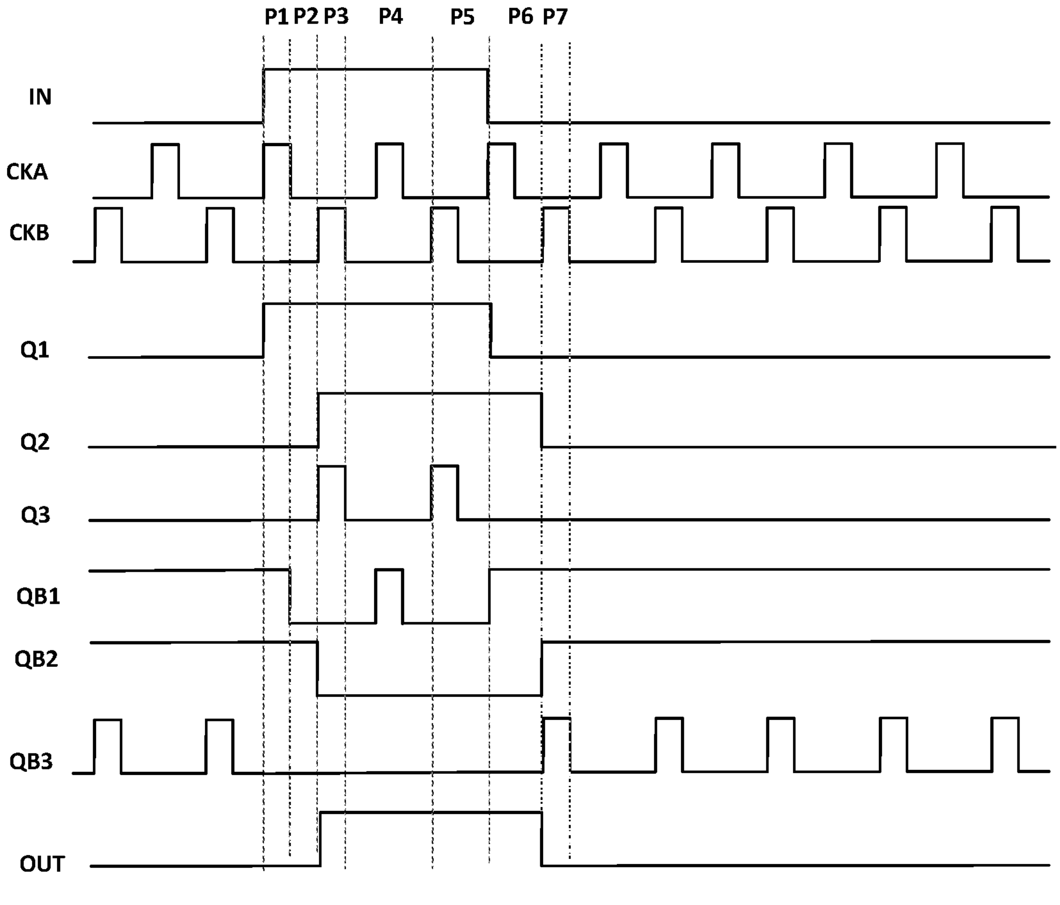
FIG. 24 shows a signal timing diagram of a shift register unit according to an embodiment of the present disclosure.

FIG. 24 shows a signal timing diagram of a shift register unit according to an embodiment of the present disclosure. This timing diagram may be applied to the shift register unit of embodiments of the present disclosure to generate a gate driving signal. For ease of illustration, the shift register unit shown in FIG. 8 is used as an example for illustration. The control method may include an input phase, an output phase, and a reset phase. As shown in FIG. 24, the input phase includes a period P1, the output phase includes periods P2 to P6, and the reset phase includes a period P7. In the input phase, the input circuit writes a high level of the input signal terminal IN to the first pull-up node Q1, and a high level of the power signal terminal VGH to the first pull-down node QB1. In the output phase, the first control circuit and the second control circuit control the second pull-up node Q2 to be at a high level, and the second pull-down node QB2 to be at a low level. The high level of the second pull-up node Q2 and the low level of the second pull-down node QB1 cause the output circuit to provide the high level of the power signal terminal VGH to the output signal terminal OUT, thereby outputting a high level. In the reset phase, the first control circuit and the second control circuit control the second pull-up node Q2 to be at a low level, and the second pull-down node QB2 to be at a high level. The low level of the second pull-up node Q2 and the low level of the second pull-down node QB2 cause the output circuit to provide the low level of the reference signal terminal VGL to the output signal terminal, thereby outputting a low level. Hereinafter, a detail illustration will be provided with reference to FIGS. 8 and 24.

In the period P1, the input signal terminal IN and the first clock signal terminal CKA are at high levels. The sixth transistor T6, the fifth transistor T5, the first transistor T1, the sixteenth transistor T16, the seventh transistor T7, the third transistor T3, and the fifteenth transistor T15 are turned on, thereby providing the high level of the input signal terminal IN to the first pull-up node Q1 and the fourth pull-up node Q4, and a high level of the power signal terminal VGH to the first pull-down node QB1. Due to a low level of the second clock signal terminal CKB, the turned on first transistor T1 and third transistor write the low level to the third pull-up node Q3, the turned on fifteenth transistor T15 and sixteenth transistor T16 write the low level to the second pull-down node QB3, and the second transistor T2 and the fourth transistor T4 are turned off so as to keep an original potential of the second pull-up node Q2 and the second pull-down node QB2. As shown in FIG. 24, the second pull-up node Q2 remains at a low level, and the second pull-down node QB2 remains at a high level. The low level of the second pull-up node Q2 causes the eleventh transistor T11 to be turned off, and the high level of the second pull-down node QB2 causes the twelfth transistor T12 to be turned on, thereby providing a low level of the reference signal terminal VGL to the output signal terminal OUT, and the output signal terminal OUT remains at a low level.

In the period P2, the first clock signal terminal CKA changes to be at a low level, and the sixth transistor T6 and the seventh transistor T7 are turned off. At this point, the high level of the first pull-up node Q1 causes the eighth transistor T8 to be turned on, thereby providing the low level of the first clock signal terminal CKA to the first pull-down node QB1. The low level of the first pull-down node QB1 causes the third transistor T3 and the fifteenth transistor T15 to be turned off, while the high level of the first pull-up node Q1 keeps the first transistor T1 and the sixteenth transistor T16 on. The second clock signal terminal CKB remains at a low level, the turned on first transistor T1 and sixteenth transistor T16 cause the third pull-up node Q3 and the third pull-down node QB3 to continue to be at a low level, while the turned off second transistor T2 and fourth transistor T4 cause the second pull-up node Q2 and the second pull-down node QB2 to continue to be at the original level, and the output signal terminal OUT continues to output a low level.

In the period P3, the first clock signal terminal CKA remains at a low level, the second clock signal terminal CKB changes to be at a high level, the first pull-up nodes Q1 and Q4 remain at a high level, and the first pull-down node QB1 remains at a low level. The first transistor T1 and the sixteenth transistor T16 remain in an on state, thereby providing the high level of the second clock signal terminal CKB to the third pull-up node Q3, and the low level of the reference signal terminal VGL to the third pull-down node QB3. The high level of the second clock signal terminal CKB causes the second transistor T2 and the fourth transistor T4 to be turned on, thereby providing the high level of the third pull-up node to the second pull-up node Q2 and the low level of the third pull-down node QB3 to the second pull-down node QB2. The high level of the second pull-up node Q2 and the low level of the second pull-down node QB2 cause the eleventh transistor T11 to be turned on and the twelfth transistor T12 to be turned off, thereby providing the high level of the power signal terminal VGH to the output signal terminal OUT, and then the output signal terminal OUT outputs a high level.

In the period P4, the second clock signal terminal CKB is at a low level, and the second transistor T2 and the fourth transistor T4 remain in an off state. Therefore, regardless of whether the first clock signal terminal CKA is at a high or low level, the second pull-up node Q2 remains at a high level, and the second pull-down node QB2 remains at a low level, so that the output signal terminal OUT continues to output a high level.

In the period P5, the first clock signal terminal CKA remains at a low level, while the second clock signal terminal CKB is at a high level and then changes to be at a low level. The fourth pull-up node Q4 remains at a high level, keeping the first transistor T1 and the sixteenth transistor in an on state. As the first transistor T1 remains in an on state, the third pull-up node Q3 follows the potential of the second clock signal terminal CKB. That is, when the second clock signal terminal CKB is at a high level, the third pull-up node Q3 is at a high level, and when the second clock signal terminal CKB is at a low level, the third pull-up node Q3 is at a low level. This ensures that regardless of whether the second clock signal terminal CKB is at a high or low level, the second transistor T2 keeps the second pull-up node Q2 at a high level. As the sixteenth transistor T16 remains in an on state, the third pull-down node QB3 remains at a low potential. Similarly, regardless of whether the second clock signal terminal CKB is at a high or low level, the fourth transistor T4 keeps the second pull-down node QB2 at a low level.

In the period P6, the input signal terminal IN changes to be at a low level and the first clock signal terminal CKA changes to be at a high level, causing the sixth transistor T6 and the seventh transistor T7 to be turned on, thereby providing the low level of the input signal terminal IN to the first pull-up node Q1 (and then writing the low level to the fourth pull-up node Q4), and providing the high level of the power signal terminal VGH to the first pull-down node QB1. The low level of the first pull-up node Q1 causes the first transistor T1 and the sixteenth transistor T16 to be turned off, while the high level of the first pull-down node QB1 causes the third transistor T3 and the fifteenth transistor T15 to be turned on. Due to the fact that the second clock signal terminal CKB remains at a low level throughout the entire period P6, even if the first clock signal terminal CKA subsequently changes to be at a low level, the second transistor T2 and the fourth transistor T4 remain in the off state, causing the second pull-up node Q2 to remain at a high level, the second pull-down node QB2 to remain at a low level, and then the output signal terminal OUT still outputs a high level.

In the period P7, the second clock signal terminal CKB changes to be at a high level and the first clock signal terminal CKA remains at a low level. At this point, due to the high level of the first pull-down node QB1, the turned on third transistor T3 keeps the third pull-up node Q3 to be at a low level, and the turned on fifteenth transistor T15 causes the third pull-down node QB3 to be at a high level. The high level of the second clock signal terminal CKB causes both the second transistor T2 and the fourth transistor T4 to be turned on, thereby transmitting the low level of the third pull-up node Q3 to the second pull-up node Q2, and the high level of the third pull-down node QB3 to the second pull-down node QB2. The low level of the second pull-up node Q2 causes the eleventh transistor T11 to be turned off, and the high level of the second pull-down node QB2 causes the twelfth transistor T12 to be turned on, thereby providing the low level of the reference signal terminal VGL to the output signal terminal OUT, and the output signal terminal OUT outputs the low level. At this point, an output is completed. In this process, the high levels of the second clock signal terminal CKB and the first pull-down node QB1 cause the ninth transistor T9 and the tenth transistor T10 to be turned on, thereby providing the low level of the reference signal terminal VGL to the fourth pull-up node Q4, which is conducive to stabilizing the fourth pull-up node Q4 at the low level.

Afterwards, regardless of whether the first clock signal terminal CKA is at a high or low level, the first pull-up node Q1 and the fourth pull-up node Q4 remain at a low level, and the first pull-down node QB1 remains at a high level. This causes the first transistor T1 and the sixteenth transistor T16 to remain in the off state, the third transistor T3 and the fifteenth transistor T15 to remain in the on state, and thus the third pull-up node Q3 to remain at a low level, The third pull-down node QB3 follows the potential of the second clock signal terminal CKB. In this way, when the second clock signal terminal CKB is at a high level, both the second transistor T2 and the fourth transistor T4 are turned on, so that the low level of the third pull-up node Q3 is provided to the second pull-up node Q2, and the high level of the third pull-down node QB3 is provided to the second pull-down node QB2. When the second clock signal terminal CKB is at a low level, both the second transistor T2 and the fourth transistor T4 are turned off, keeping the second pull-up node Q2 at a low level and the second pull-down node QB2 at a high level. That is, regardless of whether the second clock signal terminal CKB is at a high or low level, the second pull-up node Q2 remains at a low level, and the second pull-down node QB2 remains at a high level, keeping the output signal terminal OUT at a low level until a next high level of the input signal terminal IN reaches.

Figure 25:
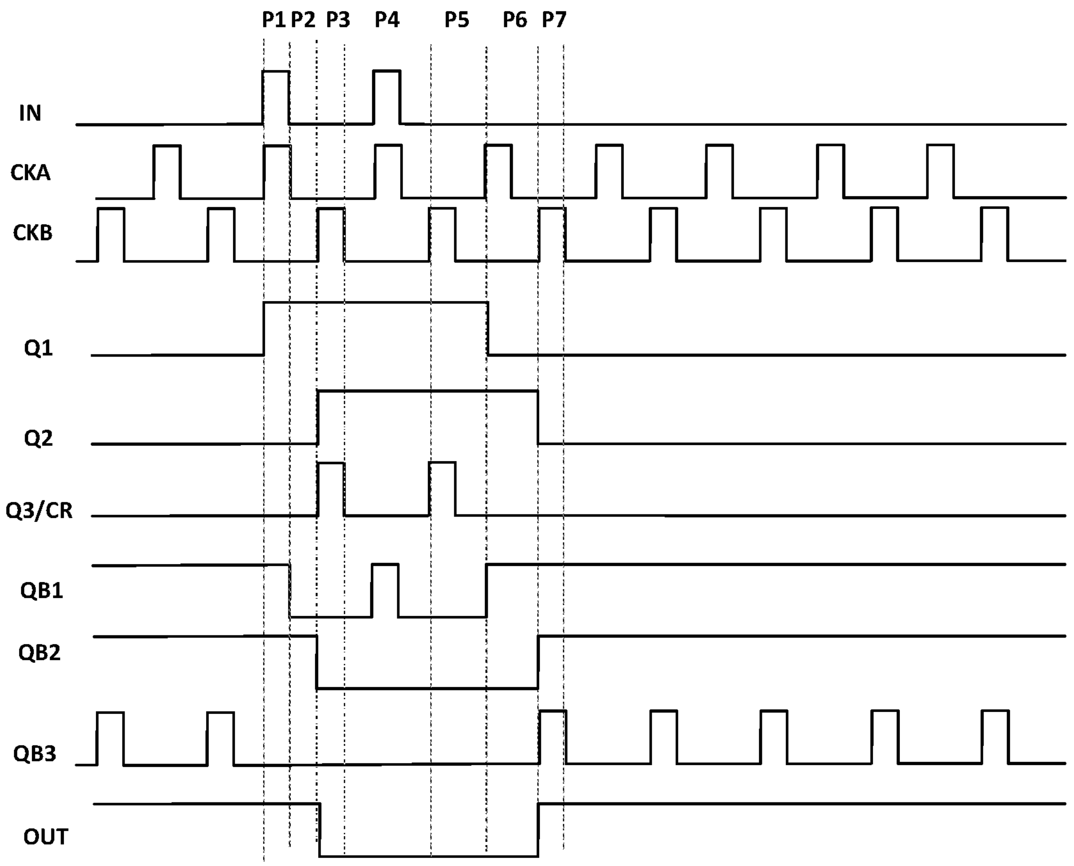
FIG. 25 shows a signal timing diagram of a shift register unit according to another embodiment of the present disclosure.

FIG. 25 shows a signal timing diagram of a shift register unit according to another embodiment of the present disclosure. This timing diagram may be applied to the shift register unit of embodiments of the present disclosure to generate a light-emitting control signal. For ease of illustration, the shift register unit shown in FIG. 12 is used as an example for illustration. The third pull-up node Q3 in the shift register unit shown in FIG. 12 is used as the control output terminal CR for cascading with another shift register unit. The shift register unit shown in FIG. 12 may receive a signal of the control output terminal of another shift register unit as an input signal. Therefore, in the example shown in FIG. 25, the signal at the input signal terminal IN has the same waveform (including two short pulses with the same cycle as the clock signal) as that of the signal at the third pull-up node of another shift register unit, which is different from the waveform of the signal at the input signal terminal IN in FIG. 24.

As shown in FIG. 25, similar to that in FIG. 24, the input phase includes the period P1, the output phase includes the periods P2 to P6, and the reset phase includes the period P7. In the input phase, the input circuit writes the high level of the input signal terminal IN to the first pull-up node Q1, and the high level of the power signal terminal VGH to the first pull-down node QB1. In the output phase, the first control circuit and the second control circuit control the second pull-up node Q2 to be at a high level, and the second pull-down node QB2 to be at a low level. The high level of the second pull-up node Q2 and the low level of the second pull-down node QB1 cause the output circuit to provide the low level of the reference signal terminal VGL to the output signal terminal OUT, thereby outputting the low level. In the reset phase, the first control circuit and the second control circuit control the second pull-up node Q2 to be at a low level, and the second pull-down node QB2 to be at a high level. The low level of the second pull-up node Q2 and the high level of the second pull-down node QB2 cause the output circuit to provide the low level of the power signal terminal VGH to the output signal terminal OUT, thereby outputting a high level. Hereinafter, a detail illustration will be provided with reference to FIGS. 12 and 25.

In the period P1, the input signal terminal IN and the first clock signal terminal CKA are at high levels. The sixth transistor T6, the fifth transistor T5, the first transistor T1, the sixteenth transistor T16, the seventh transistor T7, the third transistor T3, and the fifteenth transistor T15 are turned on, thereby providing the high level of the input signal terminal IN to the first pull-up node Q1 and the fourth pull-up node Q4, and the high level of the power signal terminal VGH to the first pull-down node QB1. Due to the low level of the second clock signal terminal CKB, the turned on first transistor T1 and third transistor write the low level to the third pull-up node Q3, the turned on fifteenth transistor T15 and sixteenth transistor T16 write the low level to the second pull-down node QB3, and the second transistor T2 and fourth transistor T4 are in an off state, keeping the original potential of the second pull-up node Q2 and the second pull-down node QB2. As shown in FIG. 25, the second pull-up node Q2 remains at a low level, and the second pull-down node QB2 remains at a high level. The low level of the second pull-up node Q2 causes the eleventh transistor T11 to be turned off, and the high level of the second pull-down node QB2 causes the twelfth transistor T12 to be turned on, thereby providing the high level of the power signal terminal VGH to the output signal terminal OUT, and the output signal terminal OUT remains at a high level.

In the period P2, the input signal terminal IN and the first clock signal terminal CKA change to be at low levels, and the sixth transistor T6 and seventh transistor T7 are turned off. At this point, the high level of the first pull-up node Q1 causes the eighth transistor T8 to be turned on, thereby providing the low level of the first clock signal terminal CKA to the first pull-down node QB1. The low level of the first pull-down node QB1 causes the third transistor T3 and the fifteenth transistor T15 to be turned off, while the high level of the first pull-up node Q1 keeps the first transistor T1 and the sixteenth transistor T16 in an on state. The second clock signal terminal CKB remains at a low level, the turned on first transistor T1 and sixteenth transistor T16 cause the third pull-up node Q3 and the third pull-down node QB3 to continue to be at a low level, while the turned off second transistor T2 and fourth transistor T4 cause the second pull-up node Q2 and the second pull-down node QB2 to continue to be at the original level, and the output signal terminal OUT continues to output a high level.

In the period P3, the first clock signal terminal CKA remains at a low level, the second clock signal terminal CKB changes to be at a high level, the first pull-up nodes Q1 and Q4 remain at high levels, and the first pull-down node QB1 remains at a low level. The first transistor T1 and the sixteenth transistor T16 remain in an on state, thereby providing the high level of the second clock signal terminal CKB to the third pull-up node Q3, and the low level of the reference signal terminal VGL to the third pull-down node QB3. The high level of the second clock signal terminal CKB causes the second transistor T2 and the fourth transistor T4 to be turned on, thereby providing the high level of the third pull-up node Q3 to the second pull-up node Q2, and the low level of the third pull-down node QB3 to the second pull-down node QB2. The high level of the second pull-up node Q2 and the low level of the second pull-down node QB2 cause the eleventh transistor T11 to be turned on and the twelfth transistor T12 to be turned off, thereby providing the low level of the reference signal terminal VGL to the output signal terminal OUT, that is, causing the output signal terminal OUT to output a low level.

In the period P4, the second clock signal terminal CKB is at a low level, and the second transistor T2 and the fourth transistor T4 remain in an off state. Therefore, regardless of whether the first clock signal terminal CKA and input signal terminal IN are at high or low levels, the second pull-up node Q2 remains at a high level, and the second pull-down node QB2 remains at a low level, so that the output signal terminal OUT continues to output a low level.

In the period P5, the first clock signal terminal CKA remains at a low level, while the second clock signal terminal CKB is at a high level and then changes to be at a low level. The fourth pull-up node Q4 remains at a high level, keeping the first transistor T1 and the sixteenth transistor in an on state. As the first transistor T1 remains in an on state, the third pull-up node Q3 follows the potential of the second clock signal terminal CKB. That is, when the second clock signal terminal CKB is at a high level, the third pull-up node Q3 is at a high level, and when the second clock signal terminal CKB is at a low level, the third pull-up node Q3 is at a low level. This ensures that regardless of whether the second clock signal terminal CKB is at a high or low level, the second transistor T2 keeps the second pull-up node Q2 at a high level. As the sixteenth transistor T16 remains in an on state, the third pull-down node QB3 remains at a low potential. Similarly, regardless of whether the second clock signal terminal CKB is at a high or low level, the fourth transistor T4 keeps the second pull-down node QB2 at a low level.

In the period P6, the input signal terminal IN changes to be at a low level and the first clock signal terminal CKA changes to be at a high level, causing the sixth transistor T6 and the seventh transistor T7 to be turned on, thereby providing the low level of the input signal terminal IN to the first pull-up node Q1 (and then writing the low level to the fourth pull-up node Q4), and providing the high level of the power signal terminal VGH to the first pull-down node QB1. The low level of the first pull-up node Q1 causes the first transistor T1 and the sixteenth transistor T16 to be turned off, while the high level of the first pull-down node QB1 causes the third transistor T3 and the fifteenth transistor T15 to be turned on. Due to the fact that the second clock signal terminal CKB remains at a low level throughout the entire period P6, even if the first clock signal terminal CKA subsequently changes to be at a low level, the second transistor T2 and the fourth transistor T4 remain in the off state, causing the second pull-up node Q2 to remain at a high level, the second pull-down node QB2 to remain at a low level, and then the output signal terminal OUT still outputs a high level.

In the period P7, the second clock signal terminal CKB changes to be at a high level and the first clock signal terminal CKA remains at a low level. At this point, due to the high level of the first pull-down node QB1, the turned on third transistor T3 keeps the third pull-up node Q3 to be at a low level, and the turned on fifteenth transistor T15 causes the third pull-down node QB3 to be at a high level. The high level of the second clock signal terminal CKB causes both the second transistor T2 and the fourth transistor T4 to be turned on, thereby transmitting the low level of the third pull-up node Q3 to the second pull-up node Q2, and the high level of the third pull-down node QB3 to the second pull-down node QB2. The low level of the second pull-up node Q2 causes the eleventh transistor T11 to be turned off, and the high level of the second pull-down node QB2 causes the twelfth transistor T12 to be turned on, thereby providing the high level of the power signal terminal VGH to the output signal terminal OUT, and the output signal terminal OUT outputs the high level. At this point, an output is completed. In this process, the high levels of the second clock signal terminal CKB and the first pull-down node QB1 cause the ninth transistor T9 and the tenth transistor T10 to be turned on, thereby providing the low level of the reference signal terminal VGL to the fourth pull-up node Q4, which is conducive to stabilizing the fourth pull-up node Q4 at the low level.

Afterwards, regardless of whether the first clock signal terminal CKA is at a high or low level, the first pull-up node Q1 and the fourth pull-up node Q4 remain at low levels, and the first pull-down node QB1 remains at a high level. This causes the first transistor T1 and the sixteenth transistor T16 to remain in the off state, the third transistor T3 and the fifteenth transistor T15 to remain in the on state, and thus the third pull-up node Q3 to remain at a low level. The third pull-down node QB3 follows the potential of the second clock signal terminal CKB. In this way, when the second clock signal terminal CKB is at a high level, both the second transistor T2 and the fourth transistor T4 are turned on, so that the low level of the third pull-up node Q3 is provided to the second pull-up node Q2, and the high level of the third pull-down node QB3 is provided to the second pull-down node QB2. When the second clock signal terminal CKB is at a low level, both the second transistor T2 and the fourth transistor T4 are turned off, keeping the second pull-up node Q2 at a low level and the second pull-down node QB2 at a high level. That is, regardless of whether the second clock signal terminal CKB is at a high or low level, the second pull-up node Q2 remains at a low level, and the second pull-down node QB2 remains at a high level, keeping the output signal terminal OUT at a high level until a next high level of the input signal terminal IN reaches.

Figure 26:
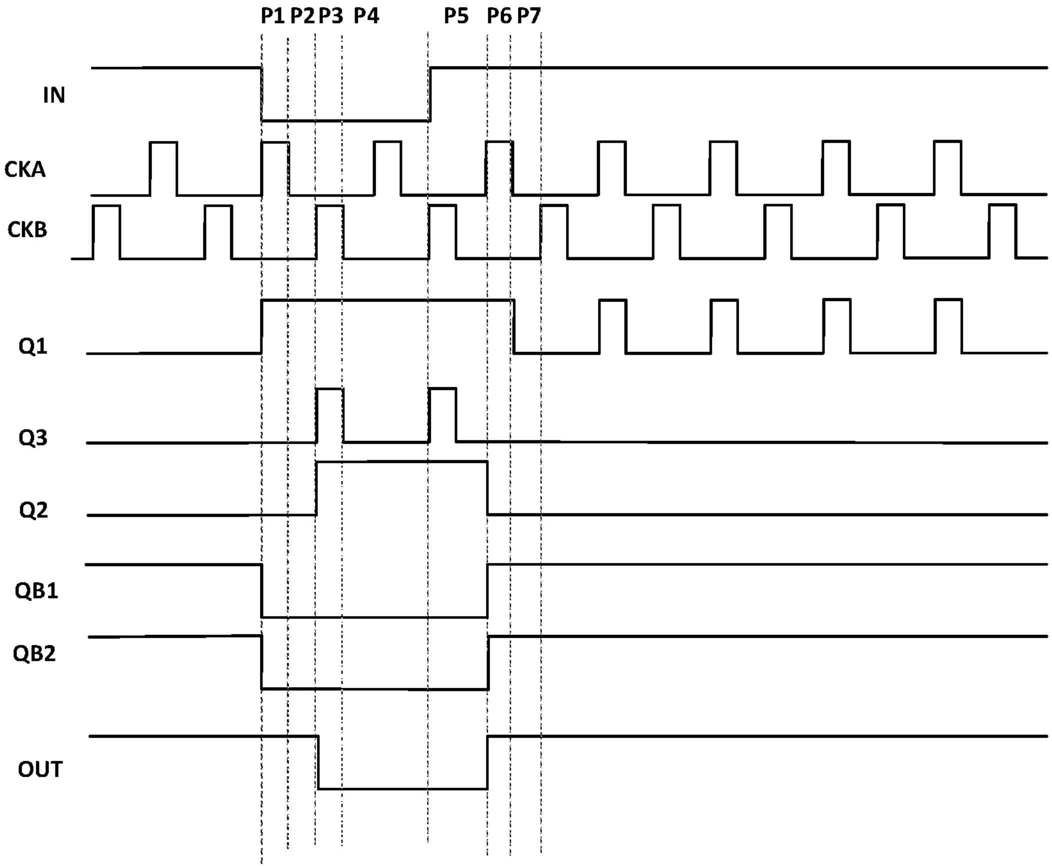
FIG. 26 shows a signal timing diagram of a shift register unit according to another embodiment of the present disclosure.

FIG. 26 shows a signal timing diagram of a shift register unit according to another embodiment of the present disclosure. This timing diagram may be applied to the shift register unit of embodiments of the present disclosure to generate a light-emitting control signal. For ease of illustration, the shift register unit shown in FIG. 15 is used as an example for illustration. The shift register unit shown in FIG. 15 is used to generate a light-emitting control signal at a valid low-level, which may receive a light-emitting control signal output from another shift register unit as an input signal. Therefore, in the example shown in FIG. 26, a signal waveform at the input signal terminal IN is a signal waveform (of a light-emitting control signal at a valid low-level) at the output signal terminal of another shift register unit.

As shown in FIG. 26, similarly, the method includes the input phase, the output phase, and the reset phase. The input phase includes the period P1, the output phase includes the periods P2 to P5, and the reset phase includes the periods P6 and P7. In the input phase, the input circuit writes the high level of the power signal terminal VGH to the first pull-up node Q1, and the low level of the input signal terminal IN to the first pull-down node QB1. In the output phase, the first control circuit and the second control circuit control the second pull-up node Q2 to be at a high level, and the second pull-down node QB2 to be at a low level. The high level of the second pull-up node Q2 and the low level of the second pull-down node QB1 cause the output circuit to provide the low level of the reference signal terminal VGL to the output signal terminal OUT, thereby outputting a low level. In the reset phase, the first control circuit and the second control circuit control the second pull-up node Q2 to be at a low level, and the second pull-down node QB2 to be at a high level. The low level of the second pull-up node Q2 and the high level of the second pull-down node QB2 cause the output circuit to provide the low level of the power signal terminal VGH to the output signal terminal OUT, thereby outputting a high level. Hereinafter, a detail illustration will be provided with reference to FIGS. 15 and 26.

In the period P1, the input signal terminal IN is at a low level, the first clock signal terminal CKA is at a high level, the sixth transistor T6, the fifth transistor T5, the first transistor T1, the seventh transistor T7, and the nineteenth transistor T19 are turned on, and the third transistor T3 is turned off, thereby providing the high level of the power signal terminal VGH to the first pull-up node Q1 and the fourth pull-up node Q4, and providing the low level of the input signal terminal IN to the first pull-down node QB1 and the second pull-down node QB2. As the second clock signal terminal CKB is at a low level, the turned on first transistor T1 writes the low level of the second clock signal terminal CKB to the third pull-up node Q3. The second transistor T2 is in an off state, causing the second pull-up node Q2 to remain at the original potential. As shown in FIG. 26, the second pull-up node Q2 remains at a low level. The low level of the second pull-up node Q2 causes the eleventh transistor T11 to be turned off, while the low level of the second pull-down node QB2 causes the twelfth transistor T12 to be turned off, and the output signal terminal OUT remains at the original high level.

In the period P2, the first clock signal terminal CKA changes to be at a low level, and the sixth transistor T6 and the seventh transistor T7 are turned off. The first pull-up node Q1 and the fourth pull-up node Q4 remain at high levels, causing the first transistor T1 to remain in an on state. At this point, as the second clock signal terminal CKB is at a low level, the third pull-up node Q3 continues to be at a low level. The second transistor T2 in the off state keeps the second pull-up node Q2 at a low level. The first pull-down node QB1 and the second pull-down node QB2 remain at low levels. The low levels of the second pull-up node Q2 and the second pull-down node QB2 keep the output signal terminal OUT at the original high level. In this process, the low level of the first pull-down node QB1 causes the eighth transistor T8 to be turned off, thereby keeping the first pull-up node Q1 at a high level. The high level of the first pull-up node Q1 and the low level of the second clock signal terminal CKB cause the ninth transistor T9 to be turned on and the tenth transistor T10 to be turned off, thereby keeping the first pull-down node QB1 at a low level. In addition, the low level of the first pull-down node QB1 causes the eighteenth transistor T18 to be turned off, thereby keeping the second pull-up node Q2 at a low level.

In the period P3, the first clock signal terminal CKA remains at a low level, the second clock signal terminal CKB changes to be at a high level, the first pull-up nodes Q1 and Q4 remain at high levels, and the first pull-down node QB1 and the second pull-down node QB2 remain at low levels. The first transistor T1 remains in an on state, thereby providing the high level of the second clock signal terminal CKB to the third pull-up node Q3. The high level of the second clock signal terminal CKB causes the second transistor T2 to be turned on, thereby providing the high level of the third pull-up node Q3 to the second pull-up node Q2. The high level of the second pull-up node Q2 and the low level of the second pull-down node QB2 cause the eleventh transistor T11 to be turned on and the twelfth transistor T12 to be turned off, thereby providing the low level of the reference signal terminal VGL to the output signal terminal OUT, that is, causing the output signal terminal OUT to output a low level.

In the period P4, the second clock signal terminal CKB is at a low level, the second transistor T2 remains in an off state, and the second pull-up node Q2 remains at a high level. As the input signal terminal IN remains at a low level, regardless of whether the seventh transistor T7 is in an on or off state, the second pull-down node QB2 remains at a low level. The high level of the second pull-up node Q2 and the low level of the second pull-down node QB2 cause the output signal terminal OUT to continue to output a low level.

In the period P5, the input signal terminal IN changes to be at a high level, the first clock signal terminal CKA remains at a low level, and the second clock signal terminal CKB is at a high level and then changes to be at a low level. The first pull-up node Q1 and the fourth pull-up node Q4 remain at high levels, keeping the first transistor T1 in an on state. As the first transistor T1 remains in an on state, the third pull-up node Q3 follows the potential of the second clock signal terminal CKB. That is, when the second clock signal terminal CKB is at a high level, the third pull-up node Q3 is at a high level, and when the second clock signal terminal CKB is at a low level, the third pull-up node Q3 is at a low level. This ensures that regardless of whether the second clock signal terminal CKB is at a high or low level, the second transistor T2 keeps the second pull-up node Q2 at a high level. As the first clock signal terminal CKA is at a low level and the seventh transistor T7 is in an off state, the first pull-down node QB1 and the second pull-down node QB2 remain at low levels. The high level of the second pull-up node Q2 and the low level of the second pull-down node QB2 cause the output signal terminal OUT to continue to output a low level.

During the periods P1 to P5, when both the second clock signal terminal CKB and the first pull-up node Q1 are at high levels, the ninth transistor T9 and the tenth transistor T10 are turned on, thereby providing the low level of the reference signal terminal VGL to the first pull-down node QB1, which is beneficial for stabilizing the first pull-down node QB1 at a low level.

In the period P6, the first clock signal terminal CKA changes to be at a high level, causing the sixth transistor T6 and the seventh transistor T7 to be turned on, thereby providing the high level of the power signal terminal VGH to the first pull-up node Q1 (which is then written to the fourth pull-up node Q4), and providing the high level of the input signal terminal IN to the first pull-down node QB1 (which is then written to the second pull-down node QB2).

The low level of the first pull-up node Q1 causes the first transistor T1 to be turned off, and the high level of the first pull-down node QB1 causes the third transistor T3 to be turned on, thereby writing the low level of the reference signal terminal VGL to the third pull-up node Q3. As the second clock signal terminal CKB remains at a low level and the second transistor T2 remains in an off state, the second pull-up node Q2 remains at a high level. The low level of the second pull-up node Q2 causes the eleventh transistor T11 to be turned off, and the high level of the second pull-down node QB2 causes the twelfth transistor T12 to be turned on, thereby providing the high level of the power signal terminal VGH to the output signal terminal OUT, and then the output signal terminal OUT outputs a high level. At this point, an output is completed.

In the period P7, the first clock signal terminal CKA changes to be at a low level, the sixth transistor T6 and the seventh transistor T7 are turned off, and the first pull-down node QB1 and the second pull-down node QB2 remain at high levels. The high level of the first pull-down node QB1 causes the eighth transistor to be turned on, thereby providing the low level of the first clock signal terminal CKA to the first pull-up node Q1. The high level of the first pull-down node QB1 also keeps the third transistor T3 in an on state, thereby keeping the third pull-up node Q3 at a low level. The low level of the second clock signal terminal CKB keeps the second transistor T2 in an off state, and the second pull-up node Q2 remains at a low level. The low level of the second pull-up node Q2 and the high level of the second pull-down node QB2 cause the output signal terminal OUT to continue to output a high level.

Afterwards, when the first clock signal terminal CKA is at a low level and the second clock signal terminal CKB is at a high level, the first pull-down node QB1 and the second pull-down node QB2 are at high levels, and the eighth transistor T8 is turned on, thereby keeping the first pull-up node Q1 at a low level. The first transistor T1 is turned off and the third transistor T3 is turned on, thereby keeping the third pull-up node Q3 at a low level. The second transistor T2 is turned on, causing the second pull-up node Q2 to be at a low level. The low level of the second pull-up node Q2 and the low level of the second pull-down node Q2 cause the output signal terminal OUT to continue to output a low level.

Afterwards, when both the first clock signal terminal CKA and the second clock signal terminal CKB are at low levels, the sixth transistor T6, the seventh transistor, and the second transistor T2 are all turned off. The second pull-up node Q2 continues to remain at a low level, the second pull-down node QB2 continues to remain at a low level, and the output signal terminal OUT continues to output a low level.

Afterwards, when the first clock signal terminal CKA is at a high level and the second clock signal terminal CKB is at a low level, the second transistor T2 is turned off, causing the second pull-up node Q2 to remain at a low level; the seventh transistor T7 is turned on, thereby keeping the first pull-down node QB1 and the second pull-down node QB2 at high levels, and then the output signal terminal OUT continues to output a low level.

That is, after the period P7, the second pull-up node Q2 remains at a low level, and the second pull-down node QB2 remains at a high level, causing the output signal terminal OUT to remain at a high level until a next low level of the input signal terminal IN reaches.

The above period P1 may correspond to the first phase. As shown in FIG. 26, in the first phase, the input circuit writes the low level of the input signal terminal IN to the first pull-down node QB1, and the high level of the power signal terminal VGH to the first pull-up node Q1. Therefore, this phase is also referred to as the input phase.

The above period P2 may correspond to the second phase. As shown in FIG. 26, in the second phase, the first control circuit keeps the first pull-up node Q1 at a high level and the first pull-down node QB1 at a low level under control of the first clock signal terminal CKA and the second clock signal terminal CKB. Therefore, this phase is also referred to as the control phase.

The above periods P3 to P7 may correspond to the third phase. The third phase may include an output phase and a reset phase, where the periods P3 to P5 may correspond to the output phase, and the periods P6 to P7 may correspond to the reset phase. As shown in FIG. 26, in the output phase, the second control circuit transmits the high level of the first pull-up node Q1 to the second pull-up node Q2, and the low level of the first pull-down node QB1 to the second pull-down node QB2. The output circuit provides the low level of the reference signal terminal to the output signal terminal, thereby outputting the low level. In the reset phase, the first control circuit and the second control circuit cause the second pull-up node Q2 to be at a low level and the second pull-down node QB2 to be at a high level under control of the first clock signal terminal CKA and the second clock signal terminal CKB. The output circuit provides the high level of the power signal terminal to the output signal terminal, thereby outputting the high level.

Those skilled in the art may understand that embodiments described above are exemplary, and those skilled in the art may improve them. The structures described in various embodiments may be freely combined without structural or principle conflicts.

After elaborating on the preferred embodiments of the present disclosure, those skilled in the art can clearly understand that various changes and approaches can be made without departing from the scope and spirit of the accompanying claims, and the present disclosure is not limited to the implementation methods of the exemplary embodiments cited in the specification.

What is claimed is:

1. A shift register unit, comprising:

a signal input circuit coupled to an input signal terminal of the shift register unit, a power signal terminal of the shift register unit, a first pull-up node of the shift register unit, and a first pull-down node of the shift register unit, and configured to provide a signal of the input signal terminal and a signal of the power signal terminal to the first pull-up node and the first pull-down node;

a first control circuit coupled to the first pull-up node and the first pull-down node, and configured to control a potential of the first pull-down node based on a potential of the first pull-up node, and control a potential of the first pull-up node based on a potential of the first pull-down node;

a second control circuit coupled to the first pull-up node of the shift register unit, the first pull-down node of the shift register unit, a second pull-up node of the shift register unit, and a second pull-down node of the shift register unit, and configured to control a potential of the second pull-up node based on a signal of the first pull-up node, and control a potential of the second pull-down node based on a signal of the first pull-down node; and an output circuit coupled to the second pull-up node of the shift register unit, the second pull-down node of the shift register unit, the power signal terminal of the shift register unit, a reference signal terminal of the shift register unit, and an output signal terminal of the shift register unit, and configured to provide one of the signal of the power signal terminal and a signal of the reference signal terminal to the output signal terminal under control of the second pull-up node and the second pull-down node;

wherein the second control circuit comprises:

a first transmission control sub-circuit coupled to the first pull-up node, a third pull-up node of the shift register unit, and a second clock signal terminal of the shift register unit, and configured to provide a signal of the second clock signal terminal to the third pull-up node under control of the first pull-up node;

a second transmission control sub-circuit coupled to the second pull-up node, the third pull-up node, and the second clock signal terminal, and configured to provide a signal at the third pull-up node to the second pull-up node under control of the second clock signal terminal;

a third transmission control sub-circuit coupled to the first pull-down node, the reference signal terminal, and the third pull-up node, and configured to provide the signal of the reference signal terminal to the third pull-up node under control of the first pull-down node; and a fourth transmission control sub-circuit coupled to the first pull-down node, the second pull-down node, and the second clock signal terminal, and configured to provide a signal at the first pull-down node to the second pull-down node under control of the second clock signal terminal.

2. The shift register unit according to claim 1, wherein the first transmission control sub-circuit comprises a first transistor and a first capacitor, a gate of the first transistor is coupled to the first pull-up node, a first electrode of the first transistor is coupled to the second clock signal terminal, a second electrode of the first transistor is coupled to the third pull-up node, and a first electrode of the first capacitor is coupled to the first pull-up node, and a second electrode of the first capacitor is coupled to the third pull-up node; and wherein the second transmission control sub-circuit comprises a second transistor, a gate of the second transistor is coupled to the second clock signal terminal, a first electrode of the second transistor is coupled to the third pull-up node, and a second electrode of the second transistor is coupled to the second pull-up node.

3. The shift register unit according to claim 1, wherein the third transmission control sub-circuit comprises a third transistor and a second capacitor, a gate of the third transistor is coupled to the first pull-down node, a first electrode of the third transistor is coupled to the reference signal terminal, a second electrode of the third transistor is coupled to the third pull-up node, a first electrode of the second capacitor is coupled to the first pull-down node, and a second electrode of the second capacitor is coupled to the reference signal terminal.

4. The shift register unit according to claim 1, wherein the fourth transmission control sub-circuit comprises a fourth transistor, a gate of the fourth transistor is coupled to the second clock signal terminal, a first electrode of the fourth transistor is coupled to the first pull-down node, and a second electrode of the fourth transistor is coupled to the second pull-down node.

5. The shift register unit according to claim 1, further comprising: a first voltage stabilizing circuit coupled between the first pull-up node and the first transmission control sub-circuit, wherein the first voltage stabilizing circuit is coupled with the first transmission control sub-circuit at a fourth pull-up node, and the first voltage stabilizing circuit is configured to stabilize a potential of the fourth pull-up node;

wherein the first voltage stabilizing circuit comprises a fifth transistor, a gate of the fifth transistor is coupled to the power signal terminal, a first electrode of the fifth transistor is coupled to the first pull-up node, and a second electrode of the fifth transistor is coupled to the fourth pull-up node.

6. The shift register unit according to claim 1, wherein the signal input circuit comprises:

a first input sub-circuit coupled to the input signal terminal, the first pull-up node, and a first clock signal terminal of the shift register unit, and configured to provide the signal of the input signal terminal to the first pull-up node under control of the first clock signal terminal; and a second input sub-circuit coupled to the power signal terminal, the first pull-down node, and the first clock signal terminal, and configured to provide the signal of the power signal terminal to the first pull-down node under control of the first clock signal terminal;

wherein the first input sub-circuit comprises a sixth transistor, a gate of the sixth transistor is coupled to the first clock signal terminal, a first electrode of the sixth transistor is coupled to the input signal terminal, and a second electrode of the sixth transistor is coupled to the first pull-up node; and wherein the second input sub-circuit comprises a seventh transistor, a gate of the seventh transistor is coupled to the first clock signal terminal, a first electrode of the seventh transistor is coupled to the power signal terminal, and a second electrode of the seventh transistor is coupled to the first pull-down node.

7. The shift register unit according to claim 6, wherein the first control circuit comprises:

a pull-up control sub-circuit coupled to the first pull-up node, the first pull-down node, and the first clock signal terminal, and configured to provide a signal of the first clock signal terminal to the first pull-down node under control of the first pull-up node; and a pull-down control sub-circuit coupled to the first pull-up node, the first pull-down node, the reference signal terminal, and the second clock signal terminal of the shift register unit, and configured to provide the signal of the reference signal terminal to the first pull-up node under control of the second clock signal terminal and the first pull-down node;

wherein the pull-up control sub-circuit comprises an eighth transistor, a gate of the eighth transistor is coupled to the first pull-up node, a first electrode of the eighth transistor is coupled to the first clock signal terminal, and a second electrode of the eighth transistor is coupled to the first pull-down node; and wherein the pull-down control sub-circuit comprises a ninth transistor and a tenth transistor, a gate of the ninth transistor is coupled to the second clock signal terminal, a first electrode of the ninth transistor is coupled to a second electrode of the tenth transistor, a second electrode of the ninth transistor is coupled to the first pull-up node or the fourth pull-up node, and a gate of the tenth transistor is coupled to the first pull-down node, and a first electrode of the tenth transistor is coupled to the reference signal terminal.

8. The shift register unit according to claim 6, wherein the output circuit comprises:

a first output sub-circuit coupled to the second pull-up node, the output signal terminal, and one of the power signal terminal and the reference signal terminal, and configured to provide the signal of the one of the power signal terminal and the reference signal terminal to the output signal terminal under control of the second pull-up node; and a second output sub-circuit coupled to the second pull-down node, the output signal terminal, and the other of the power signal terminal and the reference signal terminal, and configured to provide the signal of the other of the power signal terminal and the reference signal terminal to the output signal terminal under control of the second pull-down node.

9. The shift register unit according to claim 8, wherein the first output sub-circuit comprises an eleventh transistor and a third capacitor, a gate of the eleventh transistor is coupled to the second pull-up node, a first electrode of the eleventh transistor is coupled to the power signal terminal, a second electrode of the eleventh transistor is coupled to the output signal terminal, a first electrode of the third capacitor is coupled to the second pull-up node, and a second electrode of the third capacitor is coupled to the output signal terminal or the second clock signal terminal; and wherein the second output sub-circuit comprises a twelfth transistor and a fourth capacitor, a gate of the twelfth transistor is coupled to the second pull-down node, a first electrode of the twelfth transistor is coupled to the reference signal terminal, a second electrode of the twelfth transistor is coupled to the output signal terminal, a first electrode of the fourth capacitor is coupled to the second pull-down node, and a second electrode of the fourth capacitor is coupled to the reference signal terminal;

wherein the second output sub-circuit further comprises a thirteenth transistor and a fourteenth transistor, wherein the first electrode of the twelfth transistor is coupled to the reference signal terminal through the thirteenth transistor, wherein a gate of the thirteenth transistor is coupled to the second pull-down node, a first electrode of the thirteenth transistor is coupled to the reference signal terminal, and a second electrode of the thirteenth transistor is coupled to the first electrode of the twelfth transistor; and wherein a gate of the fourteenth transistor is coupled to the output signal terminal, a first electrode of the fourteenth transistor is coupled to the power signal terminal, and a second electrode of the fourteenth transistor is coupled to the first electrode of the twelfth transistor.

10. The shift register unit according to claim 8, wherein the first output sub-circuit comprises an eleventh transistor and a third capacitor, a gate of the eleventh transistor is coupled to the second pull-up node, a first electrode of the eleventh transistor is coupled to the reference signal terminal, a second electrode of the eleventh transistor is coupled to the output signal terminal, a first electrode of the third capacitor is coupled to the second pull-up node, and a second electrode of the third capacitor is coupled to the reference signal terminal; and the second output sub-circuit comprises a twelfth transistor and a fourth capacitor, a gate of the twelfth transistor is coupled to the second pull-down node, a first electrode of the twelfth transistor is coupled to the power signal terminal, a second electrode of the twelfth transistor is coupled to the output signal terminal, a first electrode of the fourth capacitor is coupled to the second pull-down node, and a second electrode of the fourth capacitor is coupled to the output signal terminal;

wherein the first output sub-circuit further comprises a thirteenth transistor and a fourteenth transistor, wherein the second electrode of the eleventh transistor is coupled to the output signal terminal through the thirteenth transistor, wherein a gate of the thirteenth transistor is coupled to the second pull-up node, a first electrode of the thirteenth transistor is coupled to the second electrode of the eleventh transistor, and a second electrode of the thirteenth transistor is coupled to the output signal terminal; and wherein a gate of the fourteenth transistor is coupled to the output signal terminal, a first electrode of the fourteenth transistor is coupled to the power signal terminal, and a second electrode of the fourteenth transistor is coupled to the second electrode of the eleventh transistor.

11. The shift register unit according to claim 6, further comprising a second voltage stabilizing circuit coupled between the first pull-down node and the fourth transmission control sub-circuit, wherein the second voltage stabilizing circuit is coupled with the fourth transmission sub-circuit at a third pull-down node, and the second voltage stabilizing circuit is configured to stabilize a potential of the third pull-down node;

wherein the second voltage stabilizing circuit comprises: a fifteenth transistor and a sixteenth transistor, wherein a gate of the fifteenth transistor is coupled to the first pull-down node, a first electrode of the fifteenth transistor is coupled to the second clock signal terminal, and a second electrode of the fifteenth transistor is coupled to the first electrode of the fourth transistor in the fourth transmission control sub-circuit at the third pull-down node; and wherein a gate of the sixteenth transistor is coupled to the first pull-up node or the fourth pull-up node, a first electrode of the sixteenth transistor is coupled to the reference signal terminal, and a second electrode of the sixteenth transistor is coupled to the third pull-down node;

wherein the second voltage stabilizing circuit further comprises a seventeenth transistor, a gate of the seventeenth transistor is coupled to the second clock signal terminal, a first electrode of the seventeenth transistor is coupled to the second electrode of the sixteenth transistor, and a second electrode of the seventeenth transistor is coupled to the second electrode of the fifteenth transistor;

wherein the third pull-up node serves as a control output terminal of the shift register unit for cascading with another shift register unit.

12. A display driving circuit comprising a plurality of cascaded shift register units, wherein the shift register unit is the shift register unit according to claim 1.

13. A display panel, comprising at least one display driving circuit according to claim 12 and a plurality of sub-pixels arranged in an array, wherein the sub-pixel comprises a pixel driving circuit, and the pixel driving circuit comprises:

a driving circuit having a control terminal, a first terminal, and a second terminal, and configured to generate a driving current from the first terminal to the second terminal under control of a signal of the control terminal;

a data input circuit coupled to a data signal terminal and the control terminal of the driving circuit, and configured to provide a data signal at the data signal terminal to the control terminal of the driving circuit under control of a first gate driving signal;

a compensation circuit coupled to a first voltage terminal, a second voltage terminal, the control terminal of the driving circuit and the second terminal of the driving circuit, and configured to provide a reference voltage at the second voltage terminal to the second terminal of the driving circuit under control of a second gate driving signal, and to provide an initial voltage at the first voltage terminal to the control terminal of the driving circuit under control of a third gate driving signal; and a light-emitting control circuit coupled between the first terminal of the driving circuit and a power signal terminal, and configured to couple the first terminal of the driving circuit to the power signal terminal or decouple the first terminal of the driving circuit from the power signal terminal under control of a light-emitting control signal, wherein the display driving circuit is configured to provide at least one of the first gate driving signal, the second gate driving signal, the third gate driving signal, and the light-emitting control signal to the plurality of sub-pixels.

14. A method for controlling a shift register unit, the shift register unit comprising: a signal input circuit coupled to an input signal terminal of the shift register unit, a power signal terminal of the shift register unit, a first pull-up node of the shift register unit, and a first pull-down node of the shift register unit, and configured to provide a signal of the input signal terminal and a signal of the power signal terminal to the first pull-up node and the first pull-down node; a first control circuit coupled to the first pull-up node and the first pull-down node, and configured to control a potential of the first pull-down node based on a potential of the first pull-up node, and control a potential of the first pull-up node based on a potential of the first pull-down node; a second control circuit coupled to the first pull-up node of the shift register unit, the first pull-down node of the shift register unit, a second pull-up node of the shift register unit, and a second pull-down node of the shift register unit, and configured to control a potential of the second pull-up node based on a signal of the first pull-up node, and control a potential of the second pull-down node based on a signal of the first pull-down node; and an output circuit coupled to the second pull-up node of the shift register unit, the second pull-down node of the shift register unit, the power signal terminal of the shift register unit, a reference signal terminal of the shift register unit, and an output signal terminal of the shift register unit, and configured to provide one of the signal of the power signal terminal and a signal of the reference signal terminal to the output signal terminal under control of the second pull-up node and the second pull-down node, wherein the second control circuit comprises: a first transmission control sub-circuit coupled to the first pull-up node, a third pull-up node of the shift register unit, and a second clock signal terminal of the shift register unit, and configured to provide a signal of the second clock signal terminal to the third pull-up node under control of the first pull-up node; a second transmission control sub-circuit coupled to the second pull-up node, the third pull-up node, and the second clock signal terminal, and configured to provide a signal at the third pull-up node to the second pull-up node under control of the second clock signal terminal; a third transmission control sub-circuit coupled to the first pull-down node, the reference signal terminal, and the third pull-up node, and configured to provide the signal of the reference signal terminal to the third pull-up node under control of the first pull-down node; and a fourth transmission control sub-circuit coupled to the first pull-down node, the second pull-down node, and the second clock signal terminal, and configured to provide a signal at the first pull-down node to the second pull-down node under control of the second clock signal terminal, the method comprising:

in an input phase, providing, by the signal input circuit, the signal of the input signal terminal and the signal of the power signal terminal to the first pull-up node and the first pull-down node, respectively;

in an output phase, controlling, by the first control circuit, the potential of the first pull-down node based on the potential of the first pull-up node, and controlling the potential of the first pull-up node based on the potential of the first pull-down node; transmitting, by the second control circuit, the signal of the first pull-up node to the second pull-up node and transmitting the signal of the first pull-down node to the second pull-down node, so that one of the second pull-up node and the first pull-up node is at a high level, and the other of the second pull-up node and the first pull-up node is at a low level; and providing, by the output circuit, one of the signal of the power signal terminal and the signal of the reference signal terminal to the output signal terminal under control of the second pull-up node and the second pull-down node; and in a reset phase, controlling, by the first control circuit, the potential of the first pull-down node based on the potential of the first pull-up node, and controlling the potential of the first pull-up node based on the potential of the first pull-down node; transmitting, by the second control circuit, the signal of the first pull-up node to the second pull-up node and the signal of the first pull-down node to the second pull-down node, so that one of the second pull-up node and the first pull-up node is at a high level, and the other of the second pull-up node and the first pull-up node is at a low level; and providing, by the output circuit, the other of the signal of the power signal terminal and the signal of the reference signal terminal to the output signal terminal under control of the second pull-up node and the second pull-down node.

15. The shift register unit according to claim 2, at least one of the first transistor or the second transistor is an N-type transistor.

16. The shift register unit according to claim 3, the third transistor is an N-type transistor.

17. The shift register unit according to claim 4, the fourth transistor is an N-type transistor.

18. The shift register unit according to claim 7, wherein at least one of the sixth transistor, the seventh transistor, the eighth transistor or the ninth transistor is an N-type transistor.

19. The shift register unit according to claim 9, wherein at least one of the sixth transistor, the seventh transistor, the eleventh transistor, the twelfth transistor or the thirteenth transistor is an N-type transistor.

20. The shift register unit according to claim 10, wherein at least one of the sixth transistor, the seventh transistor, the eleventh transistor, the twelfth transistor or the thirteenth transistor is an N-type transistor.

* * * * *